United States Patent
Cannara et al.

(10) Patent No.: US 11,732,377 B2
(45) Date of Patent: *Aug. 22, 2023

(54) METHODS FOR FABRICATING AND ETCHING POROUS SILICON CARBIDE STRUCTURES

(71) Applicant: Elwha LLC, Bellevue, WA (US)

(72) Inventors: Rachel Cannara, Kirkland, WA (US);
Emma Rae Mullen, Seattle, WA (US);
Fred Sharifi, Kirkland, WA (US)

(73) Assignee: Elwha LLC, Bellevue, WA (US)

( * ) Notice: Subject to any disclaimer, the term of this patent is extended or adjusted under 35 U.S.C. 154(b) by 47 days.

This patent is subject to a terminal disclaimer.

(21) Appl. No.: 17/479,567

(22) Filed: Sep. 20, 2021

(65) Prior Publication Data
US 2022/0178043 A1   Jun. 9, 2022

Related U.S. Application Data

(63) Continuation of application No. 16/434,049, filed on Jun. 6, 2019, now Pat. No. 11,124,889, which is a (Continued)

(51) Int. Cl.
*C25D 11/32* (2006.01)
*C25F 3/12* (2006.01)

(52) U.S. Cl.
CPC ............... *C25D 11/32* (2013.01); *C25F 3/12* (2013.01)

(58) Field of Classification Search
CPC .................................. C25F 3/12; C25D 11/32
See application file for complete search history.

(56) References Cited

U.S. PATENT DOCUMENTS 5,454,915 A * 10/1995 Shor .................. H01L 33/0054
438/960
2005/0199511 A1 9/2005 Kochergin et al.
(Continued)

FOREIGN PATENT DOCUMENTS

GB          1332709 A      10/1973
GB          2466940 A       7/2010
(Continued)

OTHER PUBLICATIONS

Gautier et al., "Systematic Study of Anodic Etching of Highly Doped N-type 4H-SiC in various HF Based Electrolytes", Journal of The Electrochemical Society, 160 (9) D372-D379, 2013.
(Continued)

*Primary Examiner* — Brian W Cohen
(74) *Attorney, Agent, or Firm* — Kory D. Christensen

(57) ABSTRACT

The present disclosure relates to methods of fabricating a porous structure, such as a porous silicon carbide structure. The methods can include a step of providing a structure to be rendered porous, and a step of providing an etching solution. The methods can also include a step of electrochemically etching the structure to produce pores through at least a region of the structure, resulting in the formation of a porous structure. The morphology of the porous structure can be controlled by one or more parameters of the electrochemical etching process, such as the strength of the etching solution and/or the applied voltage.

19 Claims, 20 Drawing Sheets

Related U.S. Application Data continuation of application No. PCT/US2017/066584, filed on Dec. 15, 2017.

(60) Provisional application No. 62/435,605, filed on Dec. 16, 2016.

(56) References Cited

U.S. PATENT DOCUMENTS

| | | |
|---|---|---|
| 2006/0234477 A1 | 10/2006 | Gadkaree |
| 2012/0231326 A1* | 9/2012 | Biswal .................. H01M 4/661 977/734 |
| 2013/0011656 A1 | 1/2013 | Zhang et al. |
| 2013/0187532 A1 | 7/2013 | Sharifi |
| 2015/0061487 A1 | 5/2015 | Sharifi et al. |
| 2015/0323685 A1 | 11/2015 | Nelson et al. |

FOREIGN PATENT DOCUMENTS

| | | | |
|---|---|---|---|
| JP | 2002093775 | A | 3/2002 |
| JP | 2010505728 | A | 2/2010 |
| JP | 2012234889 | A | 11/2012 |
| WO | WO 2012065825 | A2 | 5/2012 |

OTHER PUBLICATIONS

Gautier et al.,"Room light anodic etching of highly doped n-type 4H-SiC in high-concentration HF electrolytes: Difference between C and Si crystalline faces", Nanoscale Research Letters 7:367, 2012.

Gautier G et al: "Room light anodic etching of highly doped n-type 4 H-SiC in high-concentration HF electrolytes: Difference between C and Si crystalline faces," Nanoscale Research Letters Springer-Verlag USA, vol. 7, Dec. 2012 (Dec. 2012).

Gautier G et al: "Systematic Study of Anodic Etching of Highly Doped N-type 4H-SiC in Various HF Based Electrolytes," Journal of the Electrochemical Society Electrochemical Society Inc. USA, vol. 160, No. 9, 2013, pp. D372-D379.

Anh Tuan Cao et al: "Influence of the anodic etching current density on the morphology of the porous SiC layer," AIP Advances American Institute of Physics USA, vol. 4, No. 3, Mar. 2014 (Mar. 2014).

Ke et al., "Comparative columnar porous etching studies on n-type 6H SiC crystalline faces," Physica Status Solidi (b), 2008, 8(7), p. 1396-1403. (Year: 2008).

* cited by examiner

METHODS FOR FABRICATING AND ETCHING POROUS SILICON CARBIDE STRUCTURES

CROSS-REFERENCE TO RELATED APPLICATIONS

This application is a continuation of U.S. application Ser. No. 16/434,049, filed Jun. 6, 2019, for "METHODS FOR FABRICATING AND ETCHING POROUS SILICON CARBIDE STRUCTURES," which is a continuation of Patent Cooperation Treaty (PCT) Application No. PCT/US17/66584, filed Dec. 15, 2017, for "METHODS FOR FABRICATING AND ETCHING POROUS SILICON CARBIDE STRUCTURES," which claims the benefit of U.S. Provisional Application No. 62/435,605, filed Dec. 16, 2016, for "METHODS FOR FABRICATING AND ETCHING POROUS SILICON CARBIDE STRUCTURES," each of which are incorporated herein by reference.

TECHNICAL FIELD

The present disclosure relates to methods of fabricating or manufacturing porous structures, such as porous silicon carbide structures. The methods can employ electrochemical etching to produce a porous structure having a controlled and/or selected morphology.

SUMMARY

The present disclosure relates to methods of fabricating or manufacturing porous structures, such as silicon carbide structures. The methods can employ electrochemical etching to produce a porous structure having a controlled and/or selected morphology. In some embodiments, the methods comprise a step of providing a structure to be rendered porous, a step of providing an etching solution, and a step of electrochemically etching the structure to produce pores through at least a region of the structure.

The resulting porous structure can comprise a morphology that can be selected and/or controlled as desired. For example, various characteristics of the morphology, such as the pore diameter, the pore wall thickness, and the porosity, can be controlled by selecting, varying, and/or adjusting one or more fabrication parameters. Further, various characteristics of the morphology can be controlled selectively and/or independently as desired.

In various embodiments, a selected morphology can be achieved by controlling the propagation rate of the etch front as it advances through the structure during the electrochemical etching process. The propagation rate can be controlled by selecting, varying and/or adjusting the concentration of the reducing agent and/or the applied voltage. The propagation rate can be inversely related or inversely proportional to the porosity that is achieved.

In certain embodiments, the methods disclosed herein further provide for fabricating a porous structure having a substantially uniform morphology. The methods can also provide for monitoring the pore formation during the electrochemical etching process.

In additional embodiments, the methods disclosed herein also provide for etching either side of a silicon carbide structure. For example, the "Si" and/or "C" face can be etched in accordance with the principles disclosed herein to create a porous structure having a substantially uniform morphology.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The written disclosure herein describes illustrative embodiments that are non-limiting and non-exhaustive. Reference is made to certain of such illustrative embodiments that are depicted in the figures, in which:

FIGS. 2A-2B are cross-sectional images and FIG. 2C is a planar image of a surface of the porous silicon carbide structure.

FIGS. 3A-3B are cross-sectional images and FIG. 3C is a planar image of a surface of the porous silicon carbide structure.

FIGS. 4A-4B are cross-sectional images and FIG. 4C is a planar image of a surface of the porous silicon carbide structure.

DETAILED DESCRIPTION

Figure 1A:
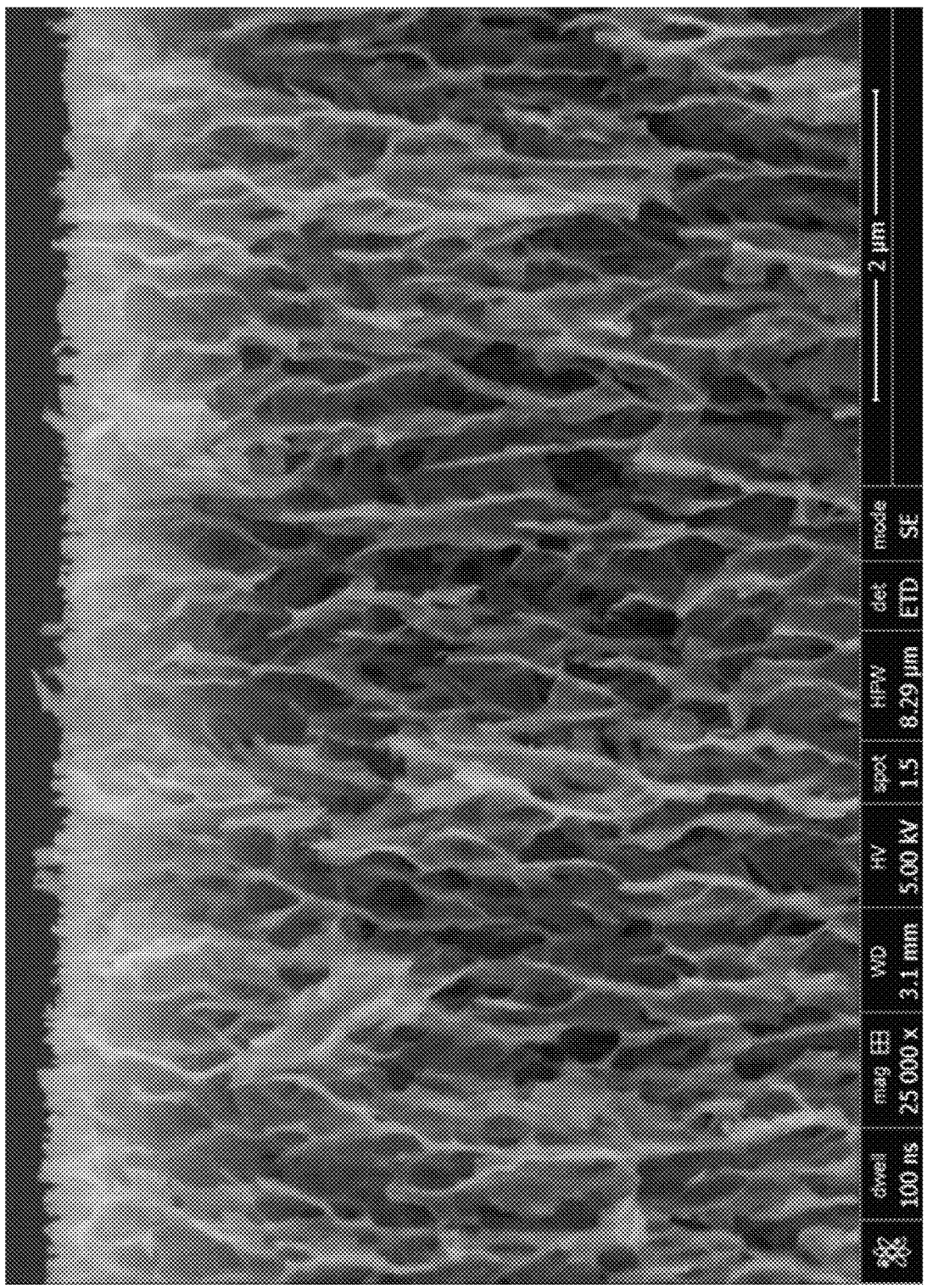
FIGS. 1A-1C are cross-sectional scanning electron microscopy (SEM) images of a variety of porous silicon carbide structures fabricated in accordance with an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Thus, the following detailed description of the embodiments of the methods of the disclosure is not intended to limit the scope of the disclosure, as claimed, but is merely representative of possible embodiments. In addition, the steps of a method do not necessarily need to be executed in any specific order, or even sequentially, nor do the steps need to be executed only once.

Porous structures, such as porous silicon carbide structures having an ordered morphology, possess physical, chemical, and electronic characteristics which may enable improvements in existing technologies and provide functionalities in new technologies. For example, they may be useful as sensors and filters for chemical and biological detection and removal, catalysis, and electron-emissive surfaces (cold cathodes or field emitters). However, porous structures can also require structural characteristics which are application-dependent, such as uniformity and order, and specific microstructural properties such as pore wall thickness and pore diameter. Further, in some applications, the porosity of a porous structure may need to be high, e.g., in excess of 90% (by mass or equivalent volume), for optimal performance of the end device.

For example, biological filters with sufficient thru-put can require structures that are macroscopic in area, where permeability is obtained through high porosity. In such applications, control over pore diameter would allow for selectivity in filtering.

As another example, catalytic structures can require specific active surface areas. In such instances, control of effective surface area in a porous structure would allow for designed catalytic reaction rates.

In another example, field emitters may be fabricated from porous structures (e.g., porous semiconductor structures). In such applications, uniformity of structure would allow for consistent performance as the device wears during operation. Further, the field enhancement factor can be dependent on pore wall thickness and pore diameter.

Silicon carbide (SiC) (e.g., a silicon carbide semiconductor), including its polytypes (e.g., 3C, 4H, 6H polytypes), is a useful material for many of the above-mentioned applications. Silicon carbide is refractory, and comprises a high Young's modulus. Silicon carbide is also robust at extremely high temperatures, allowing for operation in many environments. The properties of silicon carbide also permit self-cleaning through heat or chemical agents, enabling reusability when used in biological and chemical sensors. Further, the 4H and 6H polytypes of silicon carbide are wide band gap semiconductors; in field emission applications this property can result in enhanced emission through a work function lowered by electron affinity effects. Methods of fabricating porous silicon carbide structures having a controlled morphology is thus desirable and advantageous in many ways.

The present disclosure provides for such methods. In particular, the present disclosure provides for methods of fabricating or manufacturing porous structures, such as porous silicon carbide structures. As detailed below, the methods employ electrochemical etching, or "electroetching" or "anodization," in a controlled manner to produce pores through a region of a structure which results in the formation of a porous structure. In certain embodiments, the method provides for fabricating a porous structure having a controlled, selected, and/or desired morphology. As used herein, the term "morphology" can refer to various characteristics of the porous structure, including, but not limited to, the pore diameter, the pore wall thickness, the porosity, and/or the pore arrangement. This morphology can be varied and/or controlled as desired by selecting, varying, and/or adjusting one or more fabrication parameters of the electrochemical etching process. For example, the diameter of the pores, the thickness of the pore walls, the porosity of the porous structure, and the arrangement (e.g., order) of the pores, can each be selectively and/or independently controlled in accordance with the principles disclosed herein.

In one embodiment, the method of fabrication comprises a step of providing a structure or material that is to be etched and/or rendered porous. This structure can also be referred to as a starting structure or starting material. Various types of structures and materials can be rendered porous in accordance with the methods disclosed herein, including, but not limited to, semiconductor structures and materials (which can also be referred to as semiconductors or semiconductor wafers or slices), and silicon carbide structures and materials (including, for example, silicon carbide semiconductors). Other types of structures and materials can also be rendered porous in accordance with the methods disclosed herein.

It is contemplated that the structures and materials to be rendered porous can have various shapes, sizes, and/or thicknesses. For example, the structures to be rendered porous can be substantially cube shaped, substantially cuboid shaped, substantially prism shaped (e.g., hexagonal prism shaped), or substantially cylindrical shaped. Cylindrical shaped structures include, but are not limited to, traditional semiconductor wafers and/or slices or substrates. Structures having other shapes can also be rendered porous as desired. Additionally, it is to be understood that the methods disclosed herein are not limited to structures of any particular shape, size, and/or thickness.

In some embodiments, the structure to be rendered porous comprises one or more properties, each of which can be predefined or defined according to the structure. For example, in one embodiment, the structure to be rendered porous comprises a defined electric carrier concentration. Illustrative carrier concentrations of a silicon carbide structure of n-type doping can include, but are not limited to, concentrations from about $1.1\times10^{18}$ cm$^{-3}$ to about $1.8\times10^{18}$ cm$^{-3}$, or from about $1.2\times10^{18}$ cm$^{-3}$ to about $1.4\times10^{18}$ cm$^{-3}$.

The structure to be rendered porous can also comprise a particular crystalline structure or designation. For example, in some embodiments, the structure comprises a crystalline structure. And in certain embodiments, the structure comprises a polytype of silicon carbide. Illustrative polytypes of silicon carbide include, but are not limited to, 3C, 4H, or 6H polytypes. Other polytypes or crystalline structures of silicon carbide and other materials can also be used.

In certain embodiments, the properties of the structure or material to be rendered porous can affect and/or otherwise impact the electrochemical etching process and/or the selected fabrication parameters. For example, the carrier concentration can impact the pore diameter and/or the etch propagation rate. In one embodiment, the carrier concentration sets or defines the length scale which the electric field lines are shielded during the etching process. In such embodiments, the pore diameter decreases with increasing carrier concentration. In another embodiment, the carrier concentration sets or defines the electrical conductivity of the material. In such embodiments, the anodization current (or etch rate) increases with increasing carrier concentration. In some embodiments, the methods disclosed herein can account for the particular properties of the structure or material. For example, the properties of the structure or material (e.g., carrier concentration and/or crystalline structure) can be measured, analyzed and/or otherwise known prior to the electrochemical etching process. The fabrication parameters of the electrochemical etching process (e.g., concentration of the reducing agent, use of a surfactant, and/or voltage, etc.) can then be selected in accordance with the properties of the structure or material to be rendered porous to achieve a selected or desired morphology.

The method of fabrication disclosed herein further comprises a step of providing an etching solution, which can also be referred to as an electrolyte or anodizing solution. In some embodiments, the etching solution comprises an oxidizing agent (or oxidizer) and a reducing agent (or reducer). In particular embodiments, the etching solution further comprises one or more additional components or additives, including, but not limited to, a surfactant. As further detailed below, the etching solution can work in conjunction with an applied voltage during the electrochemical etching process to produce pores in and/or through a region of the structure that is to be rendered porous.

As can be appreciated, the oxidizing agent can react with the material of the structure to be etched (e.g., silicon carbide) to form a chemical oxide (e.g., a silicon oxide) when voltage is applied during the electrochemical etching process. For example, the oxidizing agent can be the source of oxygen atoms that are driven into the material of the structure to be etched and removed to form a chemical oxide when voltage is applied. Various types of oxidizing agents can be used, including, but not limited to, water, alcohols (e.g., ethanol, methanol, etc.), hydrogen peroxide, acetic acid or other acid-based oxidizing agents, or mixtures thereof. In a particular embodiment, the etching solution comprises water. For example, deionized water or distilled water can be used. As can be appreciated, deionized water may contain fewer contaminants, thereby minimizing and/or eliminating the formation of undesirable by-products during the electrochemical etching process. Deionized water can also be less electrically conductive than distilled water. In certain embodiments, water (e.g., deionized water) can be used to produce a porous structure that comprises a relatively ordered arrangement of pores (e.g., an ordered porous structure) as compared to a porous structure that comprises relatively randomly arranged pores (e.g., a random porous structure).

The reducing agent can be used to remove the chemical oxide formed by the oxidizing agent. Various types of reducing agents can be used, including, but not limited to, acidic reducing agents. In certain embodiments, the reducing agent comprises hydrofluoric acid. Various strengths and/or concentrations of hydrofluoric acid can be used. For example, the reducing agent can comprise hydrofluoric acid at a concentration of from about 1% to about 50%, from about 1% to about 20%, from about 1% to about 15%, from about 1% to about 10%, from about 1% to about 5%, or from about 2% to about 5% by volume (v/v %).

As previously mentioned, in certain embodiments, the etching solution further comprises a surfactant. Surfactants can be used to reduce the viscosity of the etching solution. In some embodiments, reducing the viscosity with a surfactant can increase the etch rate and aid in the formation of a more controlled and uniform porous structure. For example, reducing the viscosity of the etching solution can allow for faster diffusion of the oxidizing agent and/or reducing agent through the porous structure during the etching process. Exemplary surfactants that can be used include, but are not limited to, surfactants comprising polyoxyalkylene alkyl ether. In certain embodiments, surfactants that are stable and do not readily decompose under electrochemical conditions are used (e.g., surfactants that will not readily decompose when subjected to solutions of hydrofluoric acid and/or high voltages).

The method of fabrication disclosed herein further comprises a step of electrochemically etching the structure to remove material and produce pores through at least a region of the structure to form a porous structure. As can be appreciated, the step of electrochemical etching can be performed using a variety of different techniques and equipment. For example, in one embodiment, the structure to be electrochemically etched can be placed in electrical connection with a positive electrode or pole of a source of electrical current (e.g., a direct electrical current). A negative electrode can also be provided and placed in electrical communication with the electrical source. For example, a platinum electrode can be used as a negative electrode for facilitating electrical connection to the circuit and can be immersed in the etching solution. The structure or portion thereof to be etched can then be immersed in the etching solution. A voltage can then be applied across the platinum electrode and the structure.

In certain embodiments disclosed herein, the step of electrochemically etching comprises applying a voltage to a selected region of the structure that is to be etched or rendered porous. This voltage can produce a current density through the selected region of the structure. Various voltages can be used, including, but not limited to, ranges from about 20 V to about 40 V, about 20 V to about 30 V, and/or about 20 V to about 26 V. As further detailed below, the current density can be monitored during the electrochemical etching process to provide information about the porous structure being formed. The current density can also be monitored such that it is kept above a threshold value throughout the electrochemical etching process.

The time period for which the electrochemical etching step is performed can depend upon the desired characteristics of the structure to be etched, such as size, density, and configuration of the pores and voids and the resulting porosity of the structure. Exemplary time periods for electrochemical etching are from about 1 minute to about 8 hours, from about 5 minutes to about 4 hours, or from about 5 minutes to about 15 minutes. Greater and/or lesser time periods can also be used. Additionally, it is contemplated that the etching step can be continuous or intermittent, and that the etching step may be performed upon one or more faces (e.g., "Si" face and/or "C" face), or upon a portion or all surfaces of the structure.

The electrochemical etching step can also be performed at various temperatures, including, but not limited to, ambient temperatures, which are generally considered to be within a range of from about 65° F. (18° C.) to about 75° F. (24° C.). The electrochemical etching step can also be performed at a range of temperatures between the freezing and boiling points of the etching solution.

After subjecting the structure to the electrochemical etching step, the structure is rendered porous. In certain embodiments, highly porous structures can be obtained. For example, in some embodiments, the porosity of the porous structure is greater than about 60%, greater than about 65%, greater than about 70%, greater than about 75%, greater than about 80%, greater than about 85%, or greater than about 90%. In further embodiments, the porosity of the porous structure is from about 60% to about 96%, from about 70% to about 80%, from about 80% to about 90%, or from about 70% to about 94%, as desired. In particular embodiments, the porosity can be characterized as nanoporous. The term "nanoporous" as used herein refers to a structure that includes numerous pore walls which have a size generally within the nanometer range.

As previously stated, in certain embodiments, the methods disclosed herein provide for fabricating a porous structure having a controlled, selected, and/or desired morphology. For example, the characteristics of the morphology of the porous structure can be controlled by selecting, varying, and/or adjusting one or more fabrication parameters of the electrochemical etching process. The fabrication parameters can include the components of the etching solution, such as the type and/or concentration of the reducing agent, oxidizing agent, and optionally, a surfactant. The fabrication parameters can also include the voltage applied during the electrochemical etching process.

In certain embodiments, the controlled morphology comprises one or more of a controlled or selected pore diameter, pore wall thickness, porosity, pore arrangement (e.g., order), or combinations thereof. For example, in particular embodiments, the controlled morphology comprises a controlled pore diameter. In such embodiments, the pore diameters of the porous structure can be selected and controlled as desired. For example, larger or smaller pores can be produced as desired. In some embodiments, the average pore diameter of the porous structure can be selected such that it is within a particular range, such as between about 0.1 µm and about 3 µm. In further embodiments, the pore diameters of the porous structure can be selected such that they are substantially uniform throughout the porous region of the porous structure.

The pores of the porous structure can be selected such that they are substantially cylindrical in shape. The pores of the porous structure can also be selected such that they are substantially dendritic in shape. Further, in certain embodiments, the walls of individual pores throughout the porous structure can be etched or degraded such that individual pores may no longer be present or observable. In such embodiments, the portions of the pore walls that remain can produce a porous structure that is needle-like in appearance, as the remaining portions of the pore walls may be disconnected from each other and appear as needles or substantially elongated segments.

In another embodiment, the controlled morphology comprises a controlled pore wall thickness. In such embodiments, the pore wall thickness of the porous structure can be selected and controlled as desired. For example, in one embodiment, the pore wall thickness of the porous structure can be selected such that it is between about 2 nm and about 200 nm. Other pore wall thicknesses can also be achieved as desired. In further embodiments, the pore wall thicknesses of the porous structure can be selected such that they are substantially uniform throughout the porous region of the porous structure.

In another embodiment the controlled morphology comprises a controlled porosity. In such embodiments, the porosity of the porous structure can be selected and controlled as desired. For example, in some embodiments, the porosity of the porous structure is selected such that it is greater than about 60%, greater than about 65%, greater than about 70%, greater than about 75%, greater than about 80%, greater than about 85%, or greater than about 90%. In further embodiments, the porosity of the porous structure is selected such that it is from about 60% to about 96%, from about 70% to about 80%, from about 80% to about 90%, or from about 70% to about 94%. Other porosities can also be achieved as desired. In further embodiments, the controlled morphology comprises a selected material density.

In another embodiment the controlled morphology comprises a controlled pore arrangement. In such embodiments, the pore arrangement of the porous structure can be selected to be ordered as compared to more randomly distributed. For example, in some embodiments, the pores can be substantially aligned and/or parallel with one another. The pores can also be ordered (e.g., physically ordered) and/or arranged in a substantially uniform manner. For example, the pores can be evenly distributed and/or spaced from one another throughout the porous region. The thicknesses of the pore walls and the pore diameters can also be substantially similar and/or uniform throughout the porous region.

The ordered structure can comprise cylindrically-shaped pores. In further embodiments, the controlled morphology comprises an ordered structure comprising dendritic-shaped pores. For example, in particular embodiments, lower voltages can be used to produce a porous structure comprising a dendritic ordered structure. In other embodiments, the controlled morphology comprises a needle-like structure. For example, in particular embodiments, higher voltages can be used to produce a porous structure comprising a needle-like structure, such as the needle-like structures previously discussed.

In further embodiments, the controlled morphology comprises a substantially uniform morphology or porous structure. For example, the morphology can be selected such that it is substantially uniform throughout the porous region of the porous structure. Further, the methods disclosed herein also provide for achieving a substantially uniform morphology in relatively thick structures. For example, in some embodiments, a substantially uniform morphology can be obtained in structures having a thickness of about 10 µm, about 20 µm, or greater. For example, in some embodiments, a substantially uniform morphology can be achieved under constant etching conditions or parameters in structures having thicknesses of 20 µm or greater. In further embodiments, a substantially uniform morphology can be achieved through controlled variation of the etching parameters. For example, the concentration of the chemical constituents (e.g., the concentration of the reducing agent) can be varied during the electrochemical etching process to achieve a substantially uniform morphology. As further detailed below, pore formation can be monitored throughout the electrochemical etching process, aiding in the controlled variation of the etching parameters.

Control over the morphology can be achieved in various ways. For example, in some embodiments, a selected morphology can be achieved by controlling one or more of the etching parameters of the electrochemical etching process. For example, a selected morphology can be achieved by controlling the propagation rate of the etch front as it advances through the structure to be rendered porous. The term "etch front" can refer to the region of the structure that is being etched by the etching solution during the electrochemical etching process. As the etch front advances through the structure, pores are produced. The propagation rate (etching rate) can be manifested by the anodization current, and can decrease monotonically with time as the etch propagates. In some instances, this decrease can be attributed to the diffusion of the chemical constituents through the pores becoming more difficult due to the confined geometry of the pore structure. As the interfacial chemical constituents deplete, a threshold level can be reached which is dependent on the specific etch conditions. At this threshold level, the slope of the anodization current vs. time curve changes, reflecting a discontinuous change in the removal rate with time. This signal of discontinuity also indicates a change in morphology.

As can be appreciated, during the etching process, the etch front is a two-dimensional plane that propagates into the structure (e.g., the semiconductor wafer). As the etch front propagates inwards, the structure can form substantially cylindrically-shaped pores (or dendritically-shaped pore if desired, etc.), with the long axis along the direction of propagation and perpendicular to the two-dimensional plane that comprises the etch front. In silicon carbide structures, the intrinsic in-plane etching rate is higher than the etching rate along the long axis of the pores. Thus, if the propagation rate is decreased, more material is removed in-plane allowing for thinner pore walls and higher porosity, for a fixed voltage (pore diameter).

In some embodiments, the propagation rate of the etch front can be controlled by selecting, varying, and/or adjusting the concentration of the reducing agent (e.g., hydrofluoric acid) and/or the applied voltage (and/or optionally through the use of a surfactant). For example, in some embodiments, a selected concentration (or concentration range) of the reducing agent (e.g., hydrofluoric acid) can be used in conjunction with a selected applied voltage (or range of voltages) such that the propagation rate of the etch front produces pores that are substantially uniform in size and shape. In further embodiments, increasing the concentration of the reducing agent can increase the propagation rate of the etch front. Analogously, decreasing the concentration of the reducing agent can decrease the propagation rate of the etch front.

In particular embodiments, the concentration (or concentration range) of the reducing agent (e.g., hydrofluoric acid) and/or the applied voltage (or range of applied voltages) are selected such that the porosity of the porous structure is inversely related or inversely proportional to the propagation rate of the etch front. For example, at high propagation rates (high anodization currents), the etch front moves rapidly into the material, with reduced lateral (spreading) etching in the pores. Consequently, less material is removed per etched length along the direction of the pores and a denser structure is formed having a decreased porosity. Analogously, as the propagation rate decreases, more material is removed resulting in an increased porosity.

In certain embodiments, the concentration (or concentration range) of the reducing agent (e.g., hydrofluoric acid) and/or the applied voltage (or range of applied voltages) are selected such that the porosity of the porous structure is inversely related or inversely proportional to the concentration of the reducing agent (e.g., hydrofluoric acid). For example, as the concentration or strength of the reducing agent (e.g., hydrofluoric acid) increases, less material is removed per etched length along the direction of the pores and a denser structure is formed having a decreased porosity. Analogously, as the concentration or strength decreases, more material is removed resulting in an increased porosity.

The pore diameter can also be controlled by selecting, varying, and/or adjusting the applied voltage. For example, in some embodiments, increasing the voltage also increases the average pore diameter formed in the porous structure. Analogously, decreasing voltage can decrease the average pore diameter formed in the porous structure.

In some embodiments, a selected combination of concentrations of reducing agent and voltages can be used. For example, the selected concentration of the reducing agent (e.g., hydrofluoric acid) can be from about 1% to about 50%, from about 1% to about 20%, from about 1% to about 15%, from about 1% to about 10%, from about 1% to about 5%, or from about 2% to about 5%, by volume, and the selected voltage can be from about 20 V to about 40 V, from about 20 V to about 30 V, or from about 20 V to about 26 V. Further, in certain embodiments, the selected concentration of the reducing agent (e.g., hydrofluoric acid) and/or the selected voltage are dependent upon one or more properties of the structure to be etched or rendered porous. For example, the concentration and/or voltage can be selected to correspond to a structure having a known or predetermined carrier concentration and/or crystal structure such that a selected morphology can be achieved.

As previously mentioned, in some embodiments, the propagation rate of the etch front can be monitored to ensure a substantially constantly decreasing etch rate and/or substantially uniform pore formation. For example, the current density across the structure to be rendered porous can be monitored to ensure a substantially constantly decreasing etch rate. For example, in the anodization current vs. time plot, the value of the current at any specific time is directly related to the removal rate of the etching process. A constant slope of this plot indicates a constantly decreasing removal rate of the material, resulting in substantially uniform pore formation. A change in this slope indicates a change in the rate of decrease of the etch rate, also signaling a change in pore formation or morphology. In some embodiments, monitoring the anodization slope can allow for adjustments to be made during the etching process, such as altering the strength of the chemical constituents (e.g., hydrofluoric acid), to provide for a constant slope in the anodization current vs. time plot, and substantially uniform pore formation.

In another embodiment of the present disclosure, the methods provide for minimization and/or elimination of a denser surface layer in the porous structure. For example, in some traditional etching processes, the morphology of the porous structure differs at the surface of the porous structure. For example, in some instances the porous structure has a higher density at the surface. By controlling one or more of the etching parameters, a denser surface layer can be avoided or minimized. For example, in some embodiments, the background interfacial dielectric constant of the etching solution can be altered, for example, through the use of specific oxidizers and/or surfactants, or alternatively through selective variation of the applied voltage over time. The denser surface layer can also be removed via reactive ion etching if desired.

In yet another embodiment, the present disclosure provides for methods of etching from either the "Si" face or "C" face of the silicon carbide structure. As can be appreciated, silicon carbide is a piezoelectric material. As a piezoelectric material, the silicon carbide structure can exhibit an internal electric field that is created in the presence of stress or strain. In silicon carbide, intrinsic stress in the structure can result in an internal electric field which leads to differences in the chemical and physical properties of the two surfaces orthogonal to the field. These two surfaces can be referred to as the "Si" and "C" faces.

The different properties of the "Si" face and the "C" face can affect the electrochemical etching process. For example, on the "C" face, the internal electric field can enhance the oxidation during the electrochemical etching process, as opposed to the "Si" face where the oxidation rate can be reduced. As such, faster etching and more ordered and uniform structures were traditionally obtained when etching from the "C" face. However, by controlling one or more of the etching parameters, the methods disclosed herein are capable of being used to obtain a highly porous, ordered, and substantially uniform structure when etching from (e.g., beginning from) either the "Si" face or the "C" face of a silicon carbide structure.

In various embodiments, the methods disclosed herein also comprise an imaging step to aid in qualifying and/or quantifying the morphology of the porous structure. For example, the method can comprise a step of imaging the porous structure, for example, using a scanning electron microscope. Various characteristics of the morphology can then be assessed, including, but not limited to, the pore wall thickness, average pore diameter, porosity, and etch depth.

Other methods known in the art can also be used to assess the characteristics of the morphology.

For example, in some embodiments, the porosity can be measured using mass measurement techniques. In such embodiments, the porosity can be measured by comparing the mass of the structure before and after it has been rendered porous. The porosity can also be measured by analyzing the current and/or charge used during the electrochemical etching process. For example, the area under the anodization current vs. time plot can yield the total charge used in the process. The charge is proportional to the number of atoms removed, and is also a measure of the mass removed, and can be used to determine the porosity of the structure.

EXAMPLES

The following examples are illustrative of embodiments of the present disclosure, as described above, and are not meant to be limiting in any way.

Example 1

Three silicon carbide structures (Samples A-C) were electrochemically etched in accordance with the principles disclosed herein to demonstrate the variation in porosity and pore wall thickness achieved through control of the propagation rate of the etch front. Each of the silicon carbide structures was substantially the same size, shape, and thickness, and the electrochemical etching processes applied to each of the structures was substantially the same. The voltage applied during the electrochemical etching process for each of the samples was approximately 20 V. The only variable in the electrochemical process was the strength or concentration of the reducing agent (hydrofluoric acid). The etching solutions used for each of the samples are shown in Table 1.

TABLE 1

| Sample No. | Etching Solution (v/v %) |
|---|---|
| Sample A | 4% Hydrofluoric acid (Hydrofluoric acid, 49% (aqueous solution)) <br> 30% Ethanol <br> Balance deionized water |
| Sample B | 6% Hydrofluoric acid (Hydrofluoric acid, 49% (aqueous solution)) <br> 30% Ethanol <br> Balance deionized water |
| Sample C | 9% Hydrofluoric acid (Hydrofluoric acid, 49% (aqueous solution)) <br> 30% Ethanol <br> Balance deionized water |

After the samples were etched, the charge used in the electrochemical etching process was analyzed and the porosity of the samples was determined. The porosities of each of the samples is shown in Table 2.

TABLE 2

| Sample No. | Charge (C/μm) | Porosity (%) |
|---|---|---|
| Sample A | 0.56 | 83% |
| Sample B | 0.55 | 82% |
| Sample C | 0.52 | 79% |

As shown in Tables 1-2, the porosity was inversely related or inversely proportional to the strength or concentration of the hydrofluoric acid reducing agent. As the concentration of the hydrofluoric acid was increased, the porosity decreased.

Figure 1B:
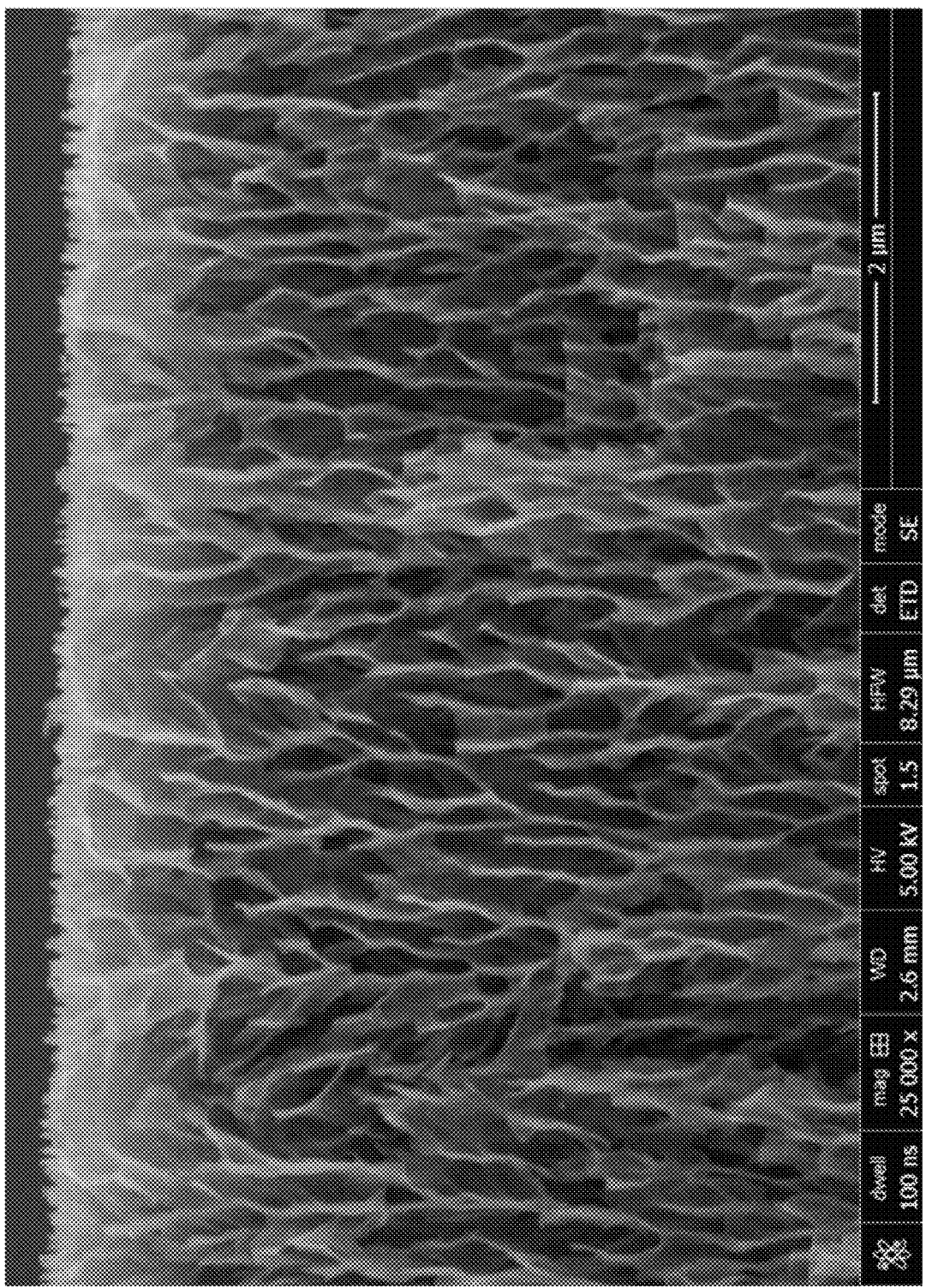
Figure 1C:
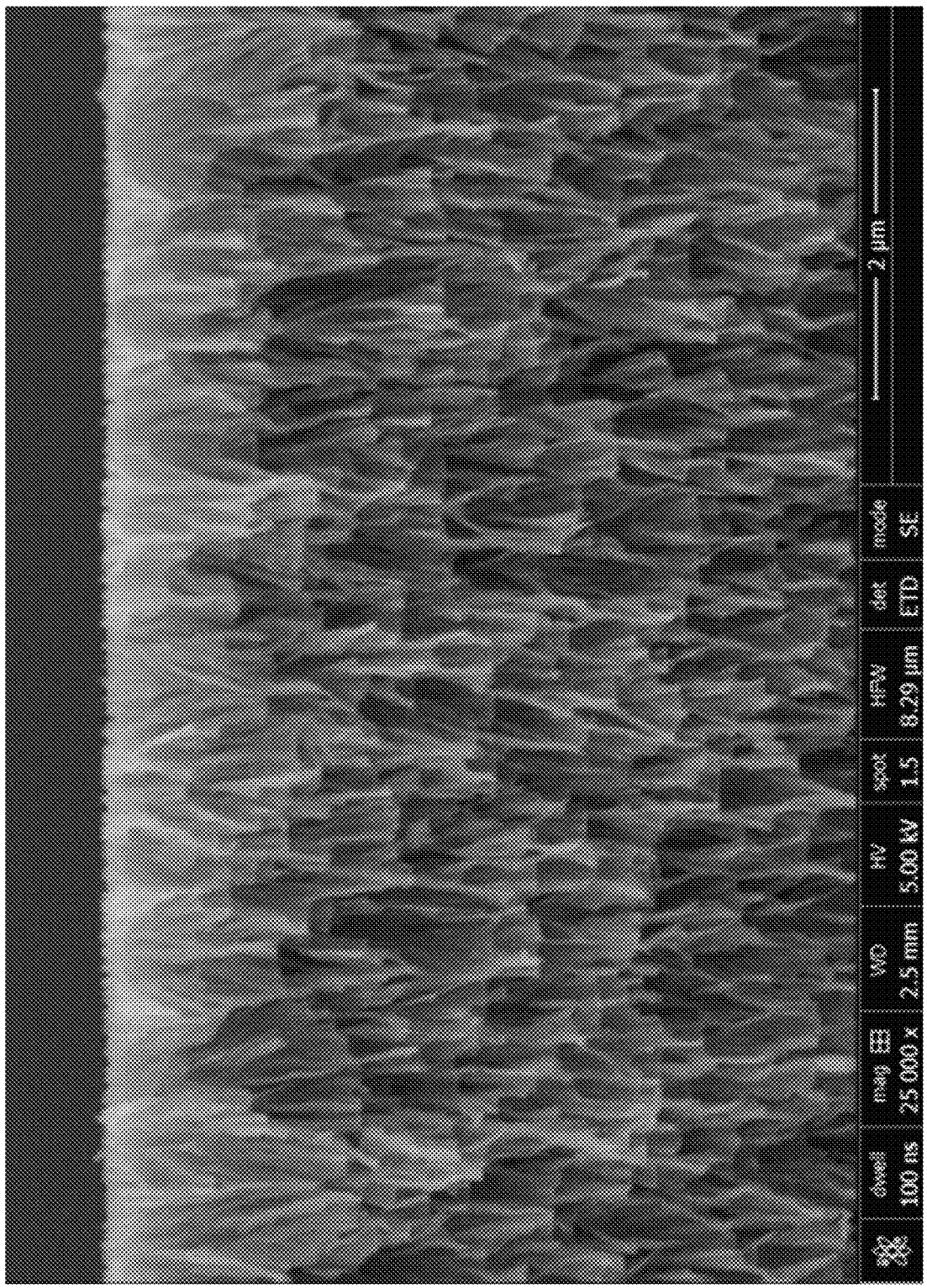

The inverse relationship between the concentration and the porosity can also be observed in SEM images that were taken of the samples. FIG. 1A is a cross-sectional SEM image of Sample A, FIG. 1B is a cross-sectional SEM image of Sample B, and FIG. 1C is a cross-sectional SEM image of Sample C. As shown therein, the pore wall thickness increased as the concentration of the hydrofluoric acid was increased, resulting in a decreased porosity and increased density.

As further shown in FIGS. 1A-1C, the morphology in each of the individual samples was substantially uniform. For example, the diameter of the pores and pore wall thickness remains substantially constant throughout the porous structures. The pores are also ordered in each of the samples.

Example 2

Three more silicon carbide structures were electrochemically etched in accordance with the principles disclosed herein to demonstrate the variation in porosity and pore diameter achieved through control of the voltage applied during the electrochemical etching process. Each of the silicon carbide structures was substantially the same size, shape, and thickness, and the concentration of the hydrofluoric acid reducing agent remained the same. The etching solution used for each of the samples was the same, and is shown in Table 3.

TABLE 3

| Sample No. | Etching Solution (v/v %) |
|---|---|
| Samples D-F | 4% Hydrofluoric acid (Hydrofluoric acid, 49% (aqueous solution)) <br> 0.5% Polyoxyalkylene Alkyl Ether Surfactant <br> Balance deionized water |

The only variable in the electrochemical process was the magnitude of the applied voltage, which was varied between 20 V and 24 V, as shown in Table 4. After the samples were etched, the charge used in the electrochemical etching process was analyzed and the porosity of the samples was determined. The porosities of each of the samples is shown in Table 4.

TABLE 4

| Sample No. | Voltage (V) | Charge (C/μm) | Porosity (%) |
|---|---|---|---|
| Sample D | 20 | 0.56 | 83% |
| Sample E | 22 | 0.60 | 86% |
| Sample F | 24 | 0.71 | 93% |

As shown in Table 4, the porosity was directly related to the magnitude of the applied voltage. As the voltage increased, the porosity also increased.

Figure 2A:
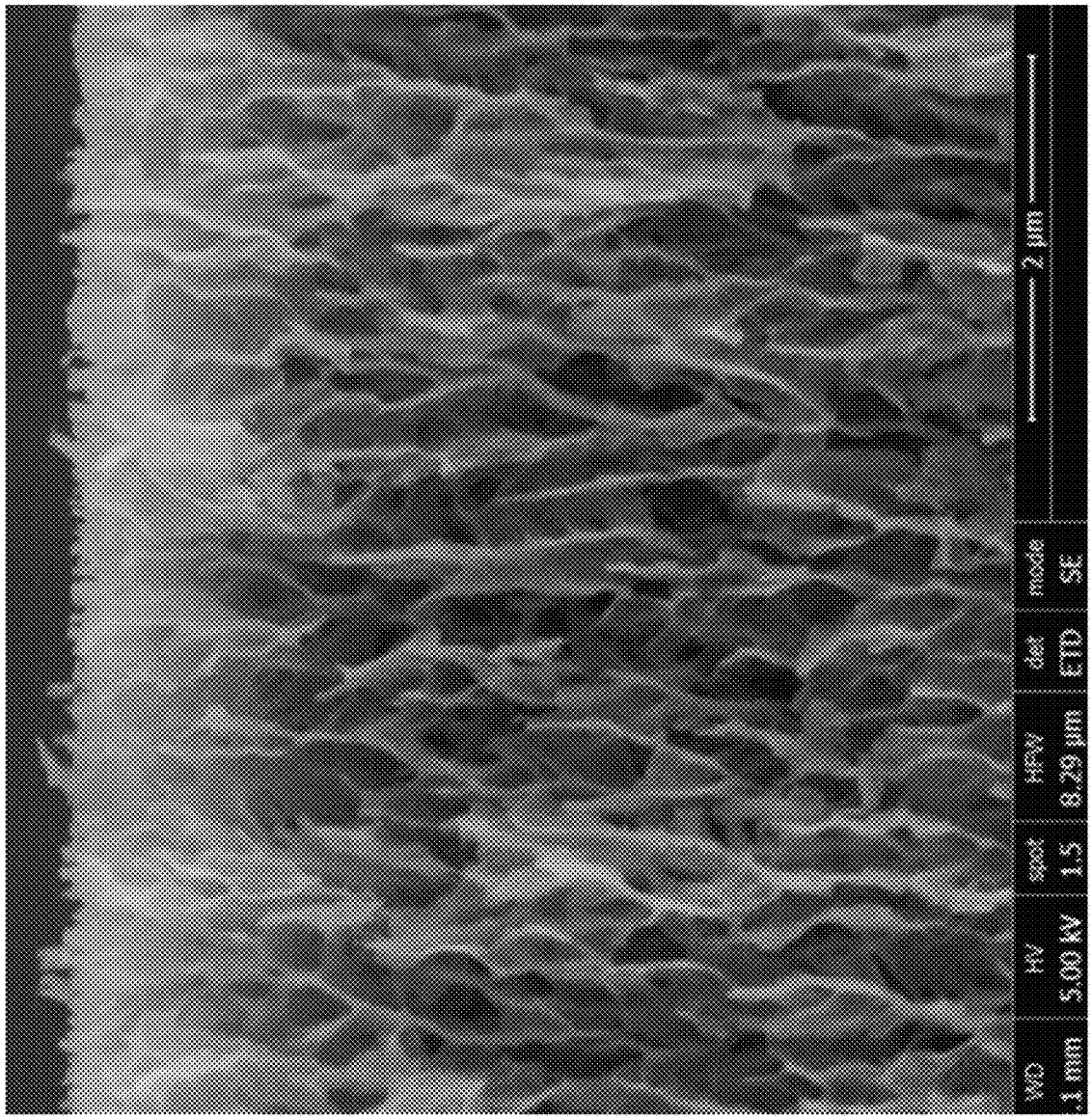
FIGS. 2A-2C are SEM images of a porous silicon carbide structure, where
Figure 2B:
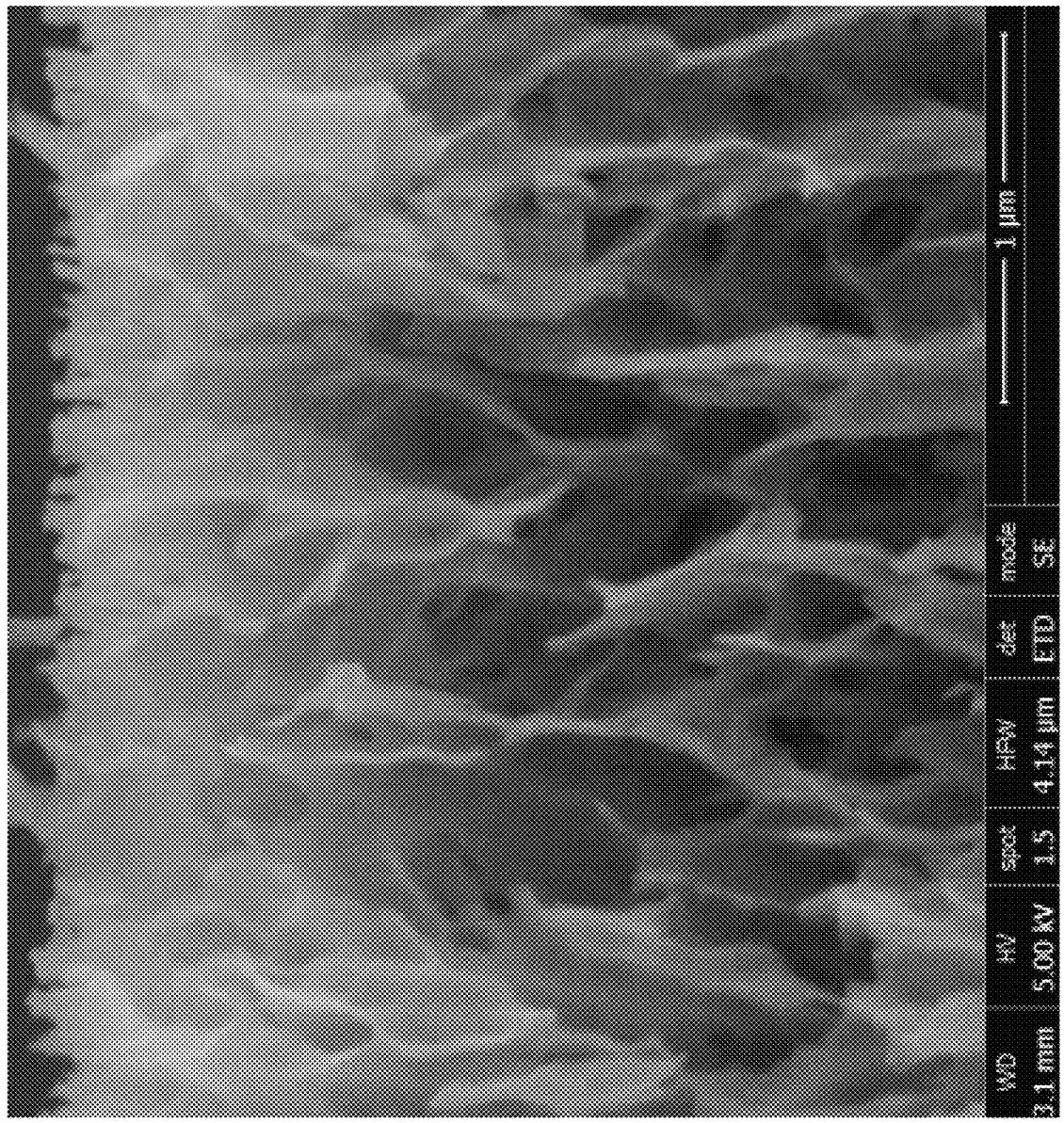
Figure 2C:
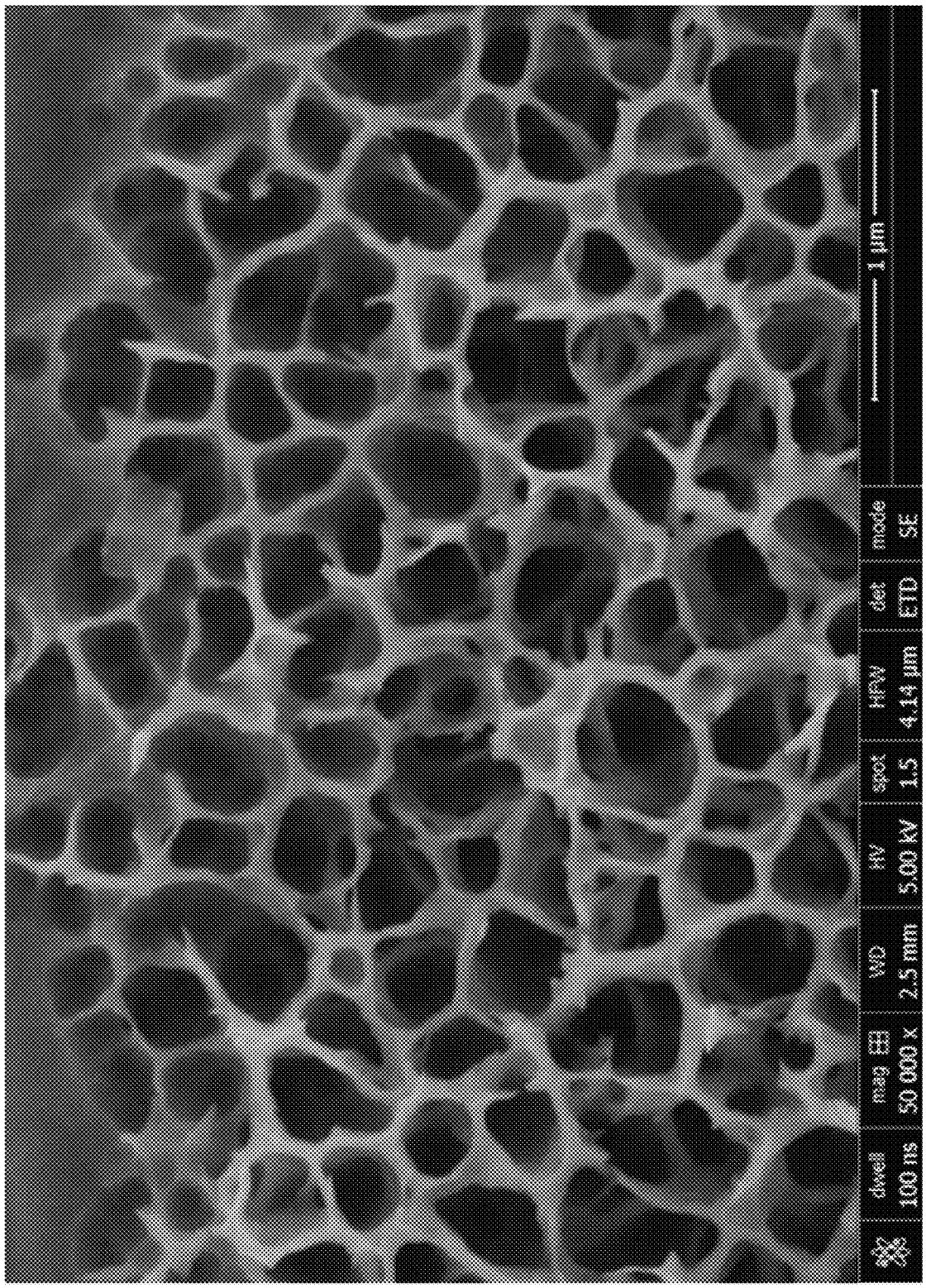
Figure 3A:
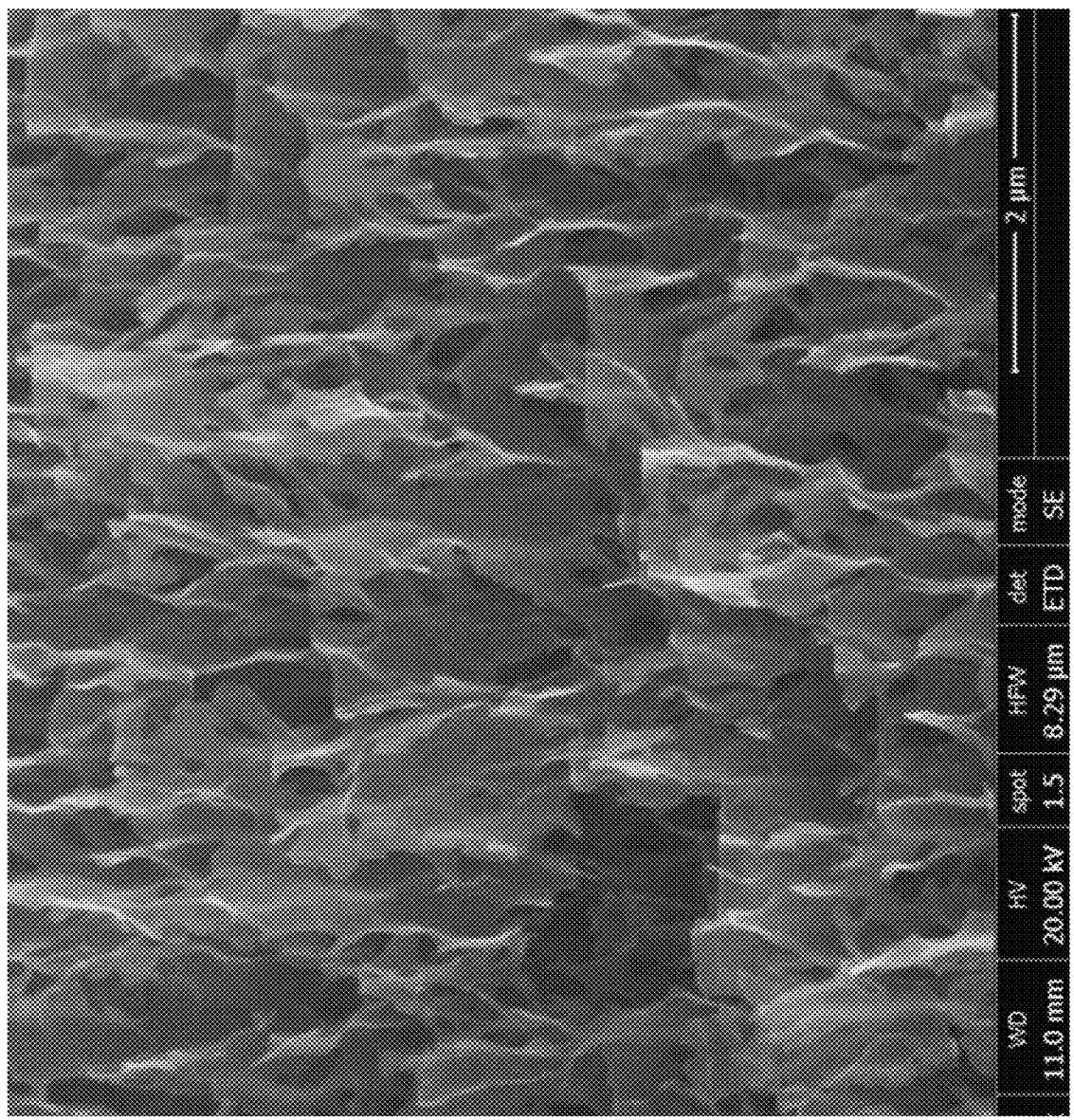
FIGS. 3A-3C are SEM images of another porous silicon carbide structure, where
Figure 3B:
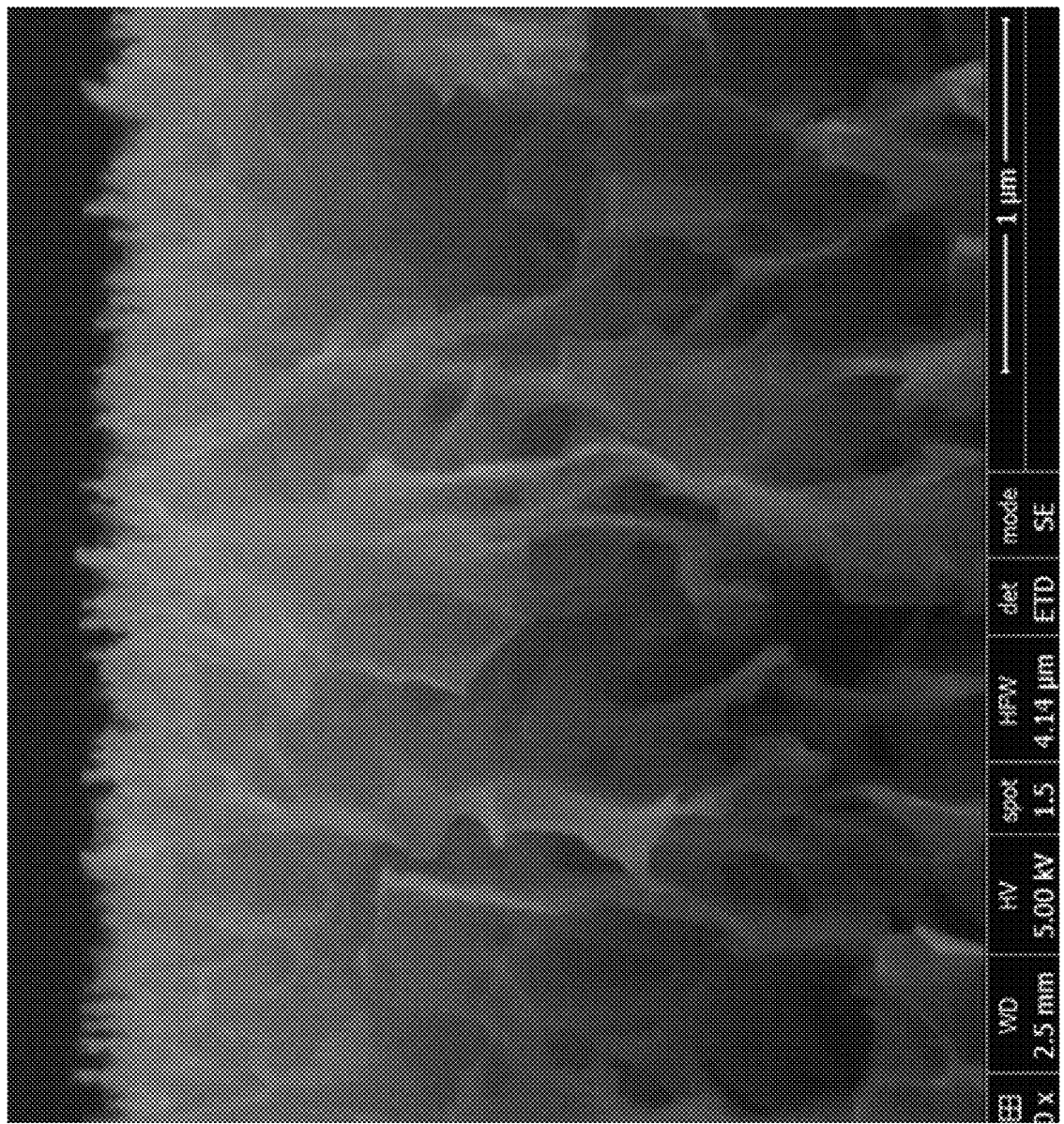
Figure 3C:
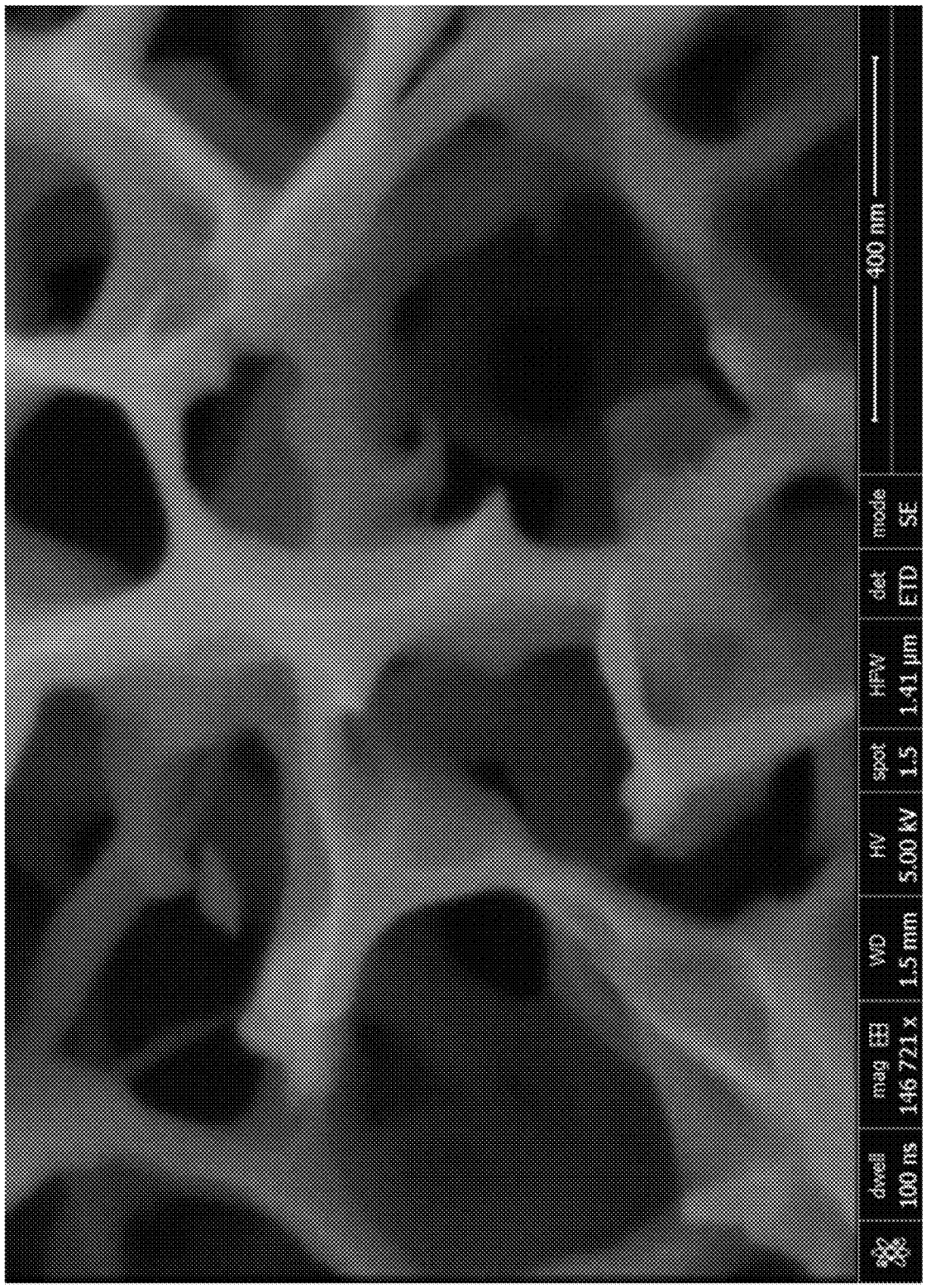
Figure 4A:
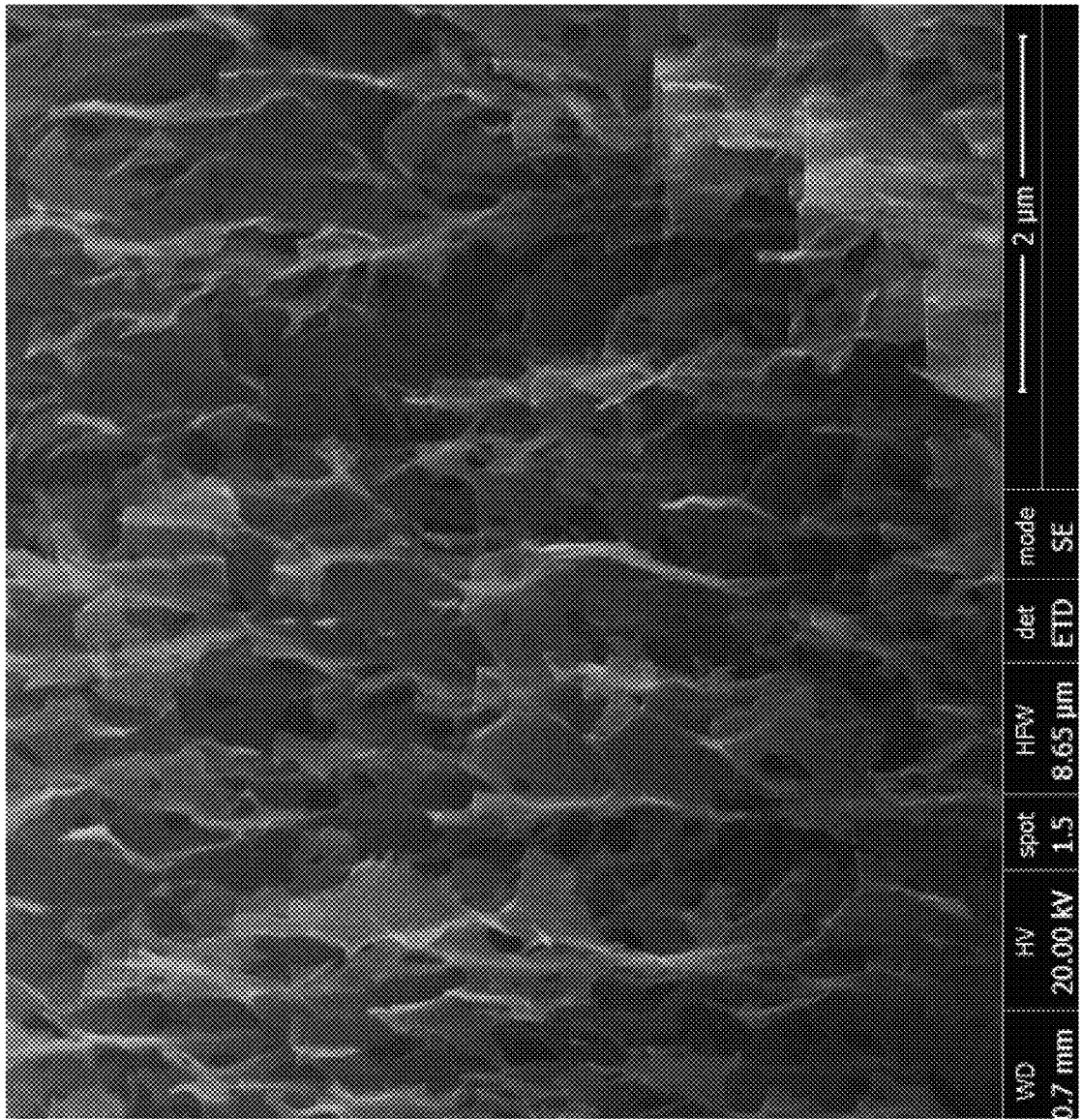
FIGS. 4A-4C are SEM images of another porous silicon carbide structure, where
Figure 4B:
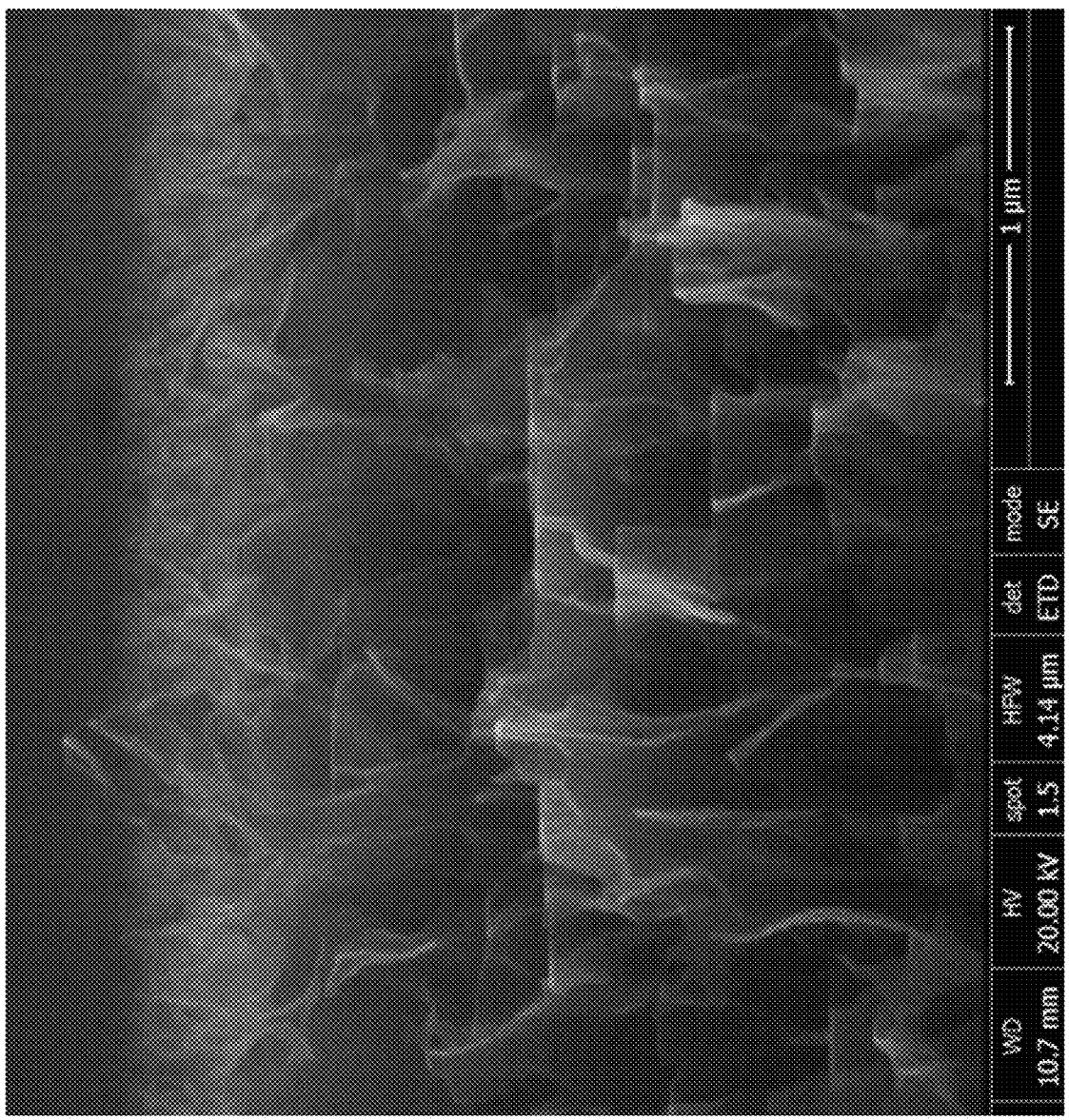
Figure 4C:
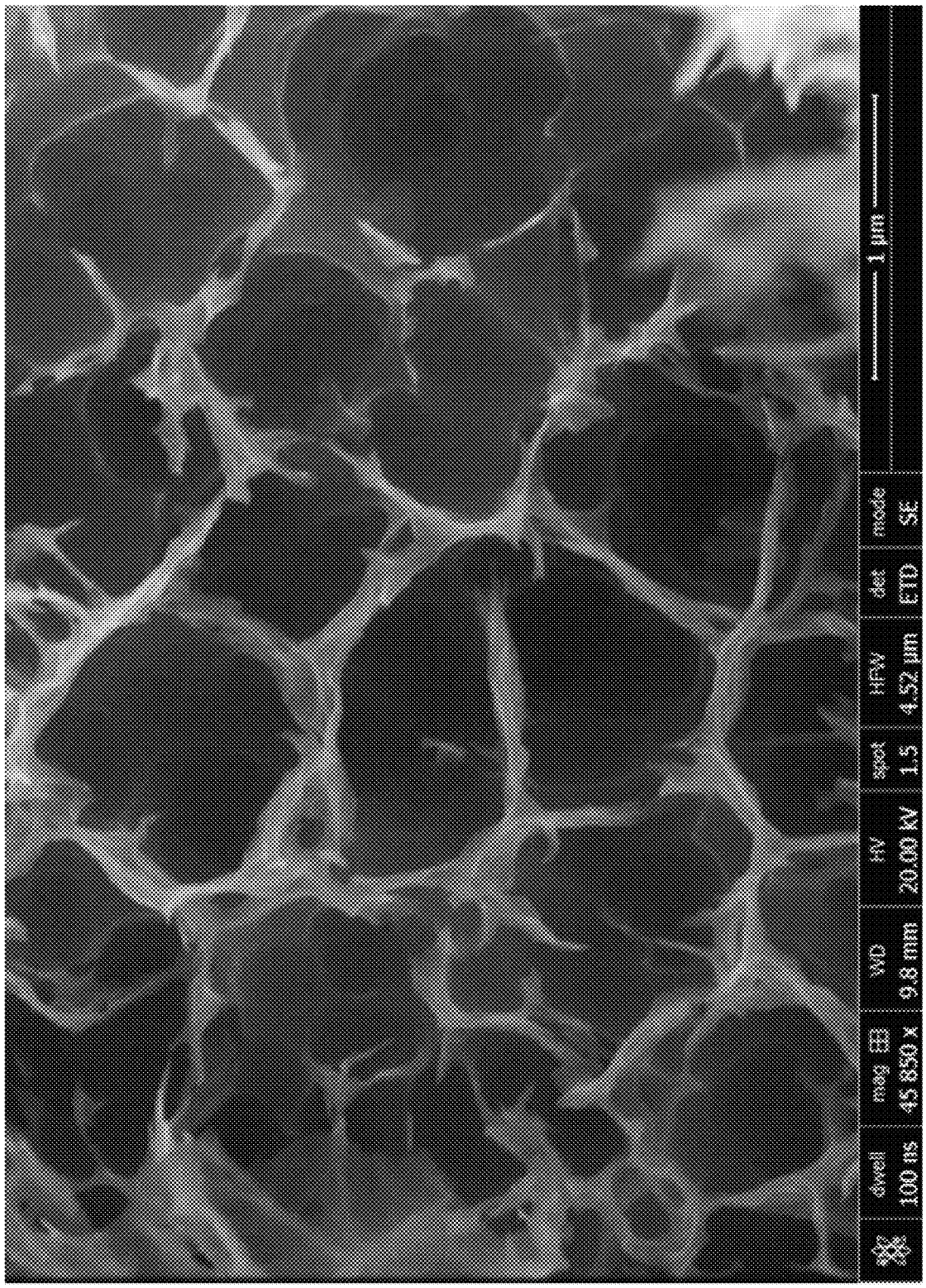

The relationship between the applied voltage and the pore diameter and porosity can also be observed in SEM images that were taken of the samples. FIGS. 2A-2C are SEM images of Sample D, FIGS. 3A-3C are SEM images of Sample E, and FIGS. 4A-4C are SEM images of Sample F. More specifically, FIGS. 2A-2B are cross-sectional SEM images, and FIG. 2C is a surface SEM image of Sample D; FIGS. 3A-3B are cross-sectional SEM images, and FIG. 3C is a surface SEM image of Sample E; and FIGS. 4A-4B are cross-sectional SEM images, and FIG. 4C is a surface SEM image of Sample F. As shown therein, the pore diameter and porosity increased with increased voltage. Like porosity, the pore diameter was directly related to the voltage applied. Higher voltages produced a larger average pore diameter.

As further shown in FIGS. 2A-2B, 3A-3B, and 4A-4B, the morphology in each of the individual samples was substantially uniform. For example, the diameter of the pores and pore wall thickness remains substantially constant throughout the porous structures. The pores are also ordered in each of the samples.

Example 3

Another silicon carbide structure was electrochemically etched in accordance with the principles disclosed herein to create a porous silicon carbide structure (Sample G) having a substantially uniform morphology. The etching solution used is provided in Table 5, and the voltage used in the electrochemical etching process was approximately 24 V.

TABLE 5

| Sample No. | Etching Solution (v/v %) |
| --- | --- |
| Sample G | 3.5% Hydrofluoric acid (Hydrofluoric acid, 49% (aqueous solution))<br>0.5% Polyoxyalkylene Alkyl Ether Surfactant<br>Balance deionized water |

Figure 5A:
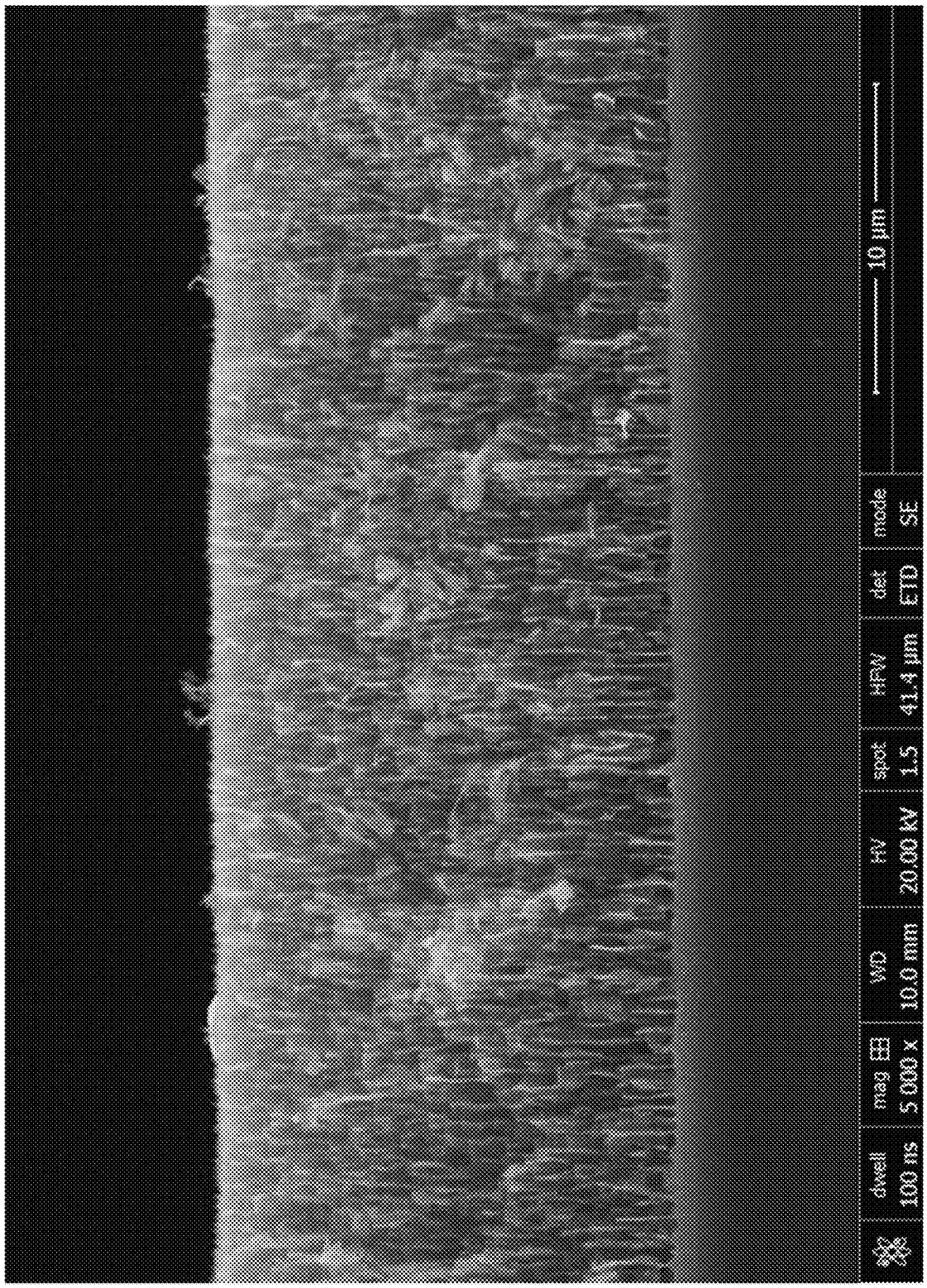
FIG. 5A is a cross-sectional SEM image of a porous silicon carbide structure, according to another embodiment of the present disclosure.

A cross-sectional SEM image of the resulting porous structure (Sample G) is shown in FIG. 5A. As shown in FIG. 5A, the morphology of the porous silicon carbide structure was substantially uniform throughout the porous region. For example, the diameter of the pores and the pore wall thickness are substantially the same throughout the porous region. The pores are also ordered.

Figure 5B:
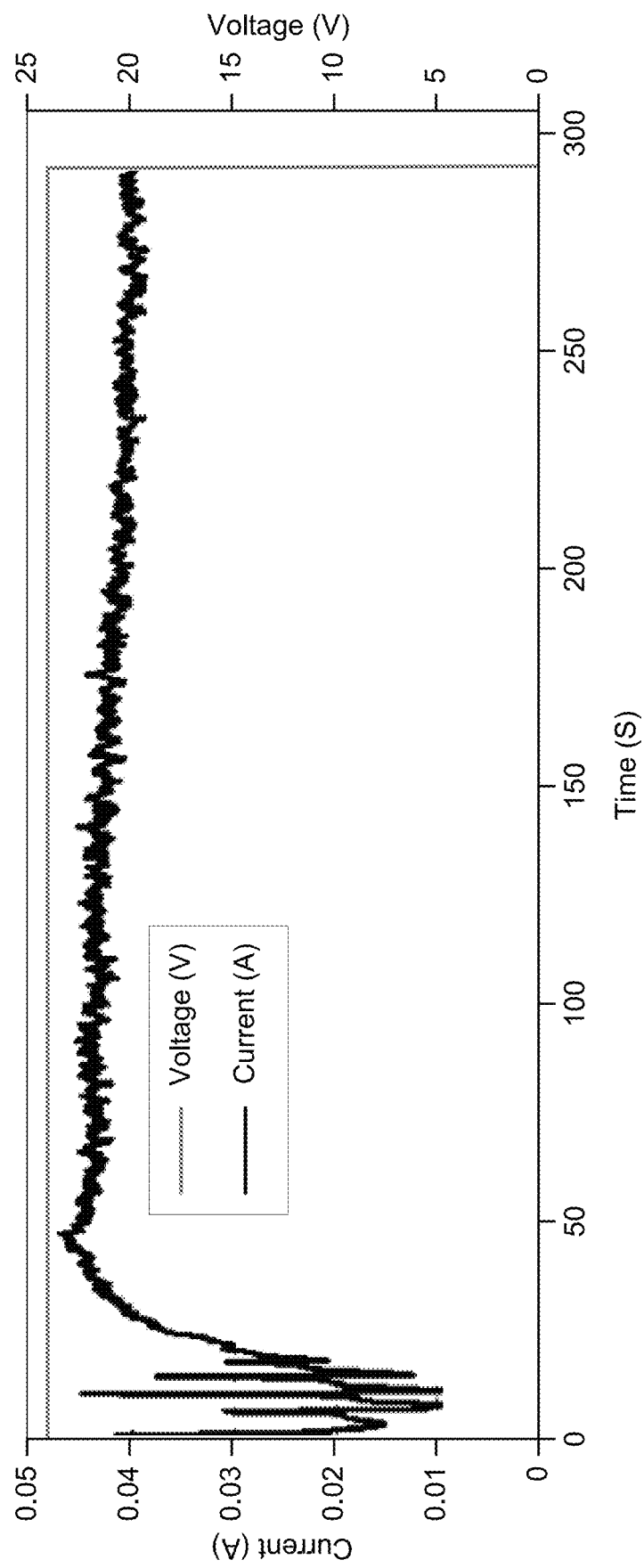
FIG. 5B is a plot of the anodization current vs. time corresponding to the electrochemical etch process used in the fabrication of the structure depicted in FIG. 5A.

The controlled and uniform porosity of Sample G are also evidenced by the anodization current vs. time plot shown in FIG. 5B. As shown in FIG. 5B, there is an initiation time of approximately 50 seconds after which the current decreases at a substantially constant rate over time, indicating that the pore formation is substantially uniform throughout the electrochemical etching process.

Example 4

Figure 6A:
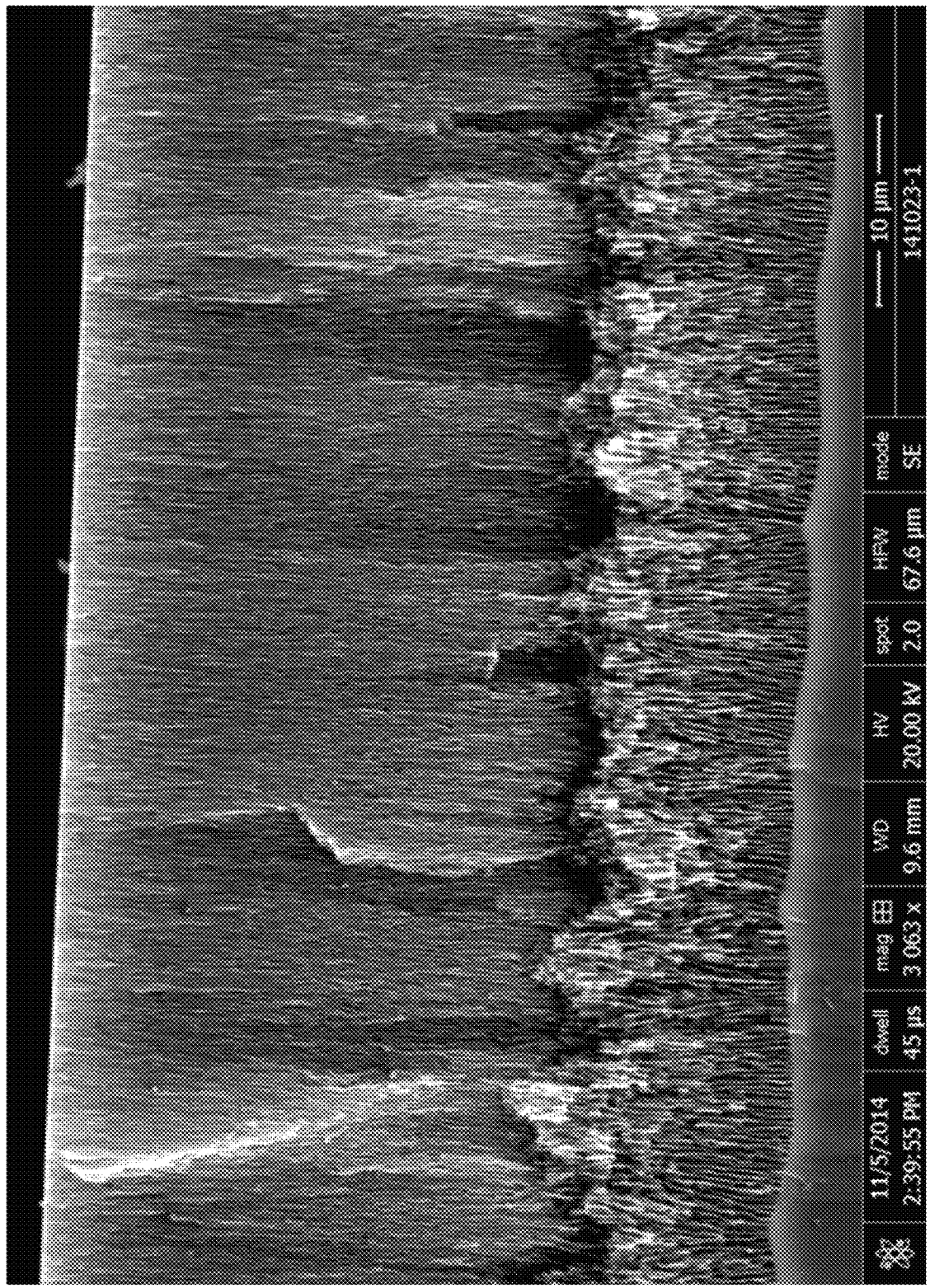
FIG. 6A is a cross-sectional SEM image of a comparative porous silicon carbide structure.
Figure 6B:
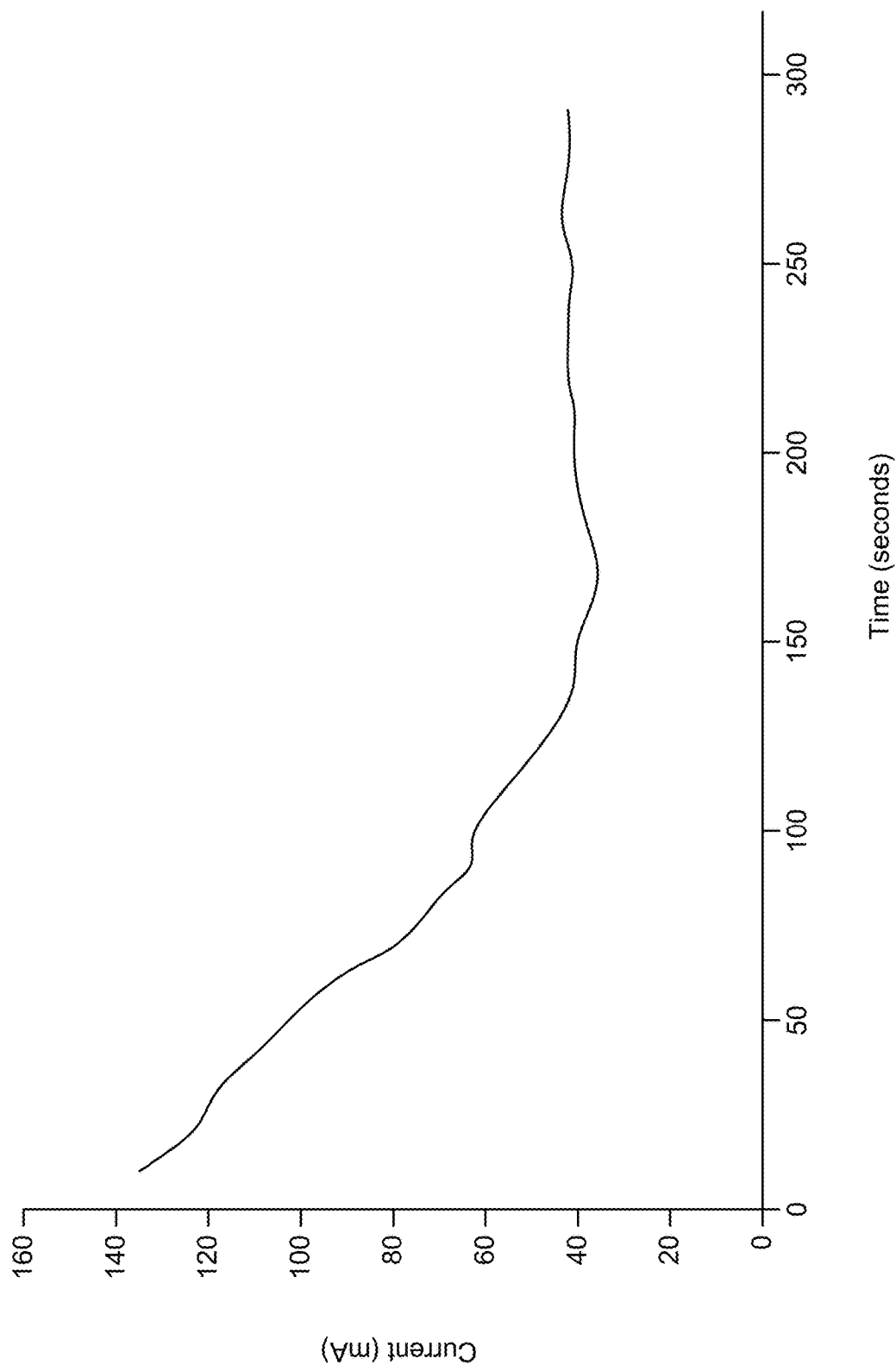
FIG. 6B is a plot of the anodization current vs. time corresponding to the electrochemical etch process used in the fabrication of the comparative structure depicted in FIG. 6A.

A silicon carbide structure was electrochemically etched as a comparison to the silicon carbide structure discussed in Example 3. The comparative silicon carbide structure (Sample H) comprised a non-uniform morphology, as shown in a cross-sectional SEM image depicted in FIG. 6A. As shown in FIG. 6A, the porosity distinctly changes from the upper portion to the bottom portion of the structure. The non-uniform porosity is also evidenced by the anodization current vs. time plot shown in FIG. 6B. As shown in FIG. 6B, the slope of the anodization current changes at approximately 150 seconds, indicating a change in morphology.

In certain embodiments discussed herein, the fabrication parameters can be modified or adjusted when a change in slope is observed. For example, the strength or concentration of the reducing agent could have been increased or adjusted to better control the morphology and uniformity thereof.

Example 5

Another silicon carbide structure was electrochemically etched in accordance with the principles disclosed herein to create a porous silicon carbide structure (Sample I) having a substantially uniform density throughout the porous region. In particular, the fabrication parameters were selected and/or controlled such that the porous structure did not exhibit a significantly denser layer at the upper surface. The etching solution used is provided in Table 6, and the voltage used in the electrochemical etching process was approximately 20 V.

TABLE 6

| Sample No. | Etching Solution (% v/v) |
| --- | --- |
| Sample I | 4% Hydrofluoric acid (Hydrofluoric acid, 49% (aqueous solution))<br>0.5% Polyoxyalkylene Alkyl Ether Surfactant<br>Balance deionized water |

Figure 7:
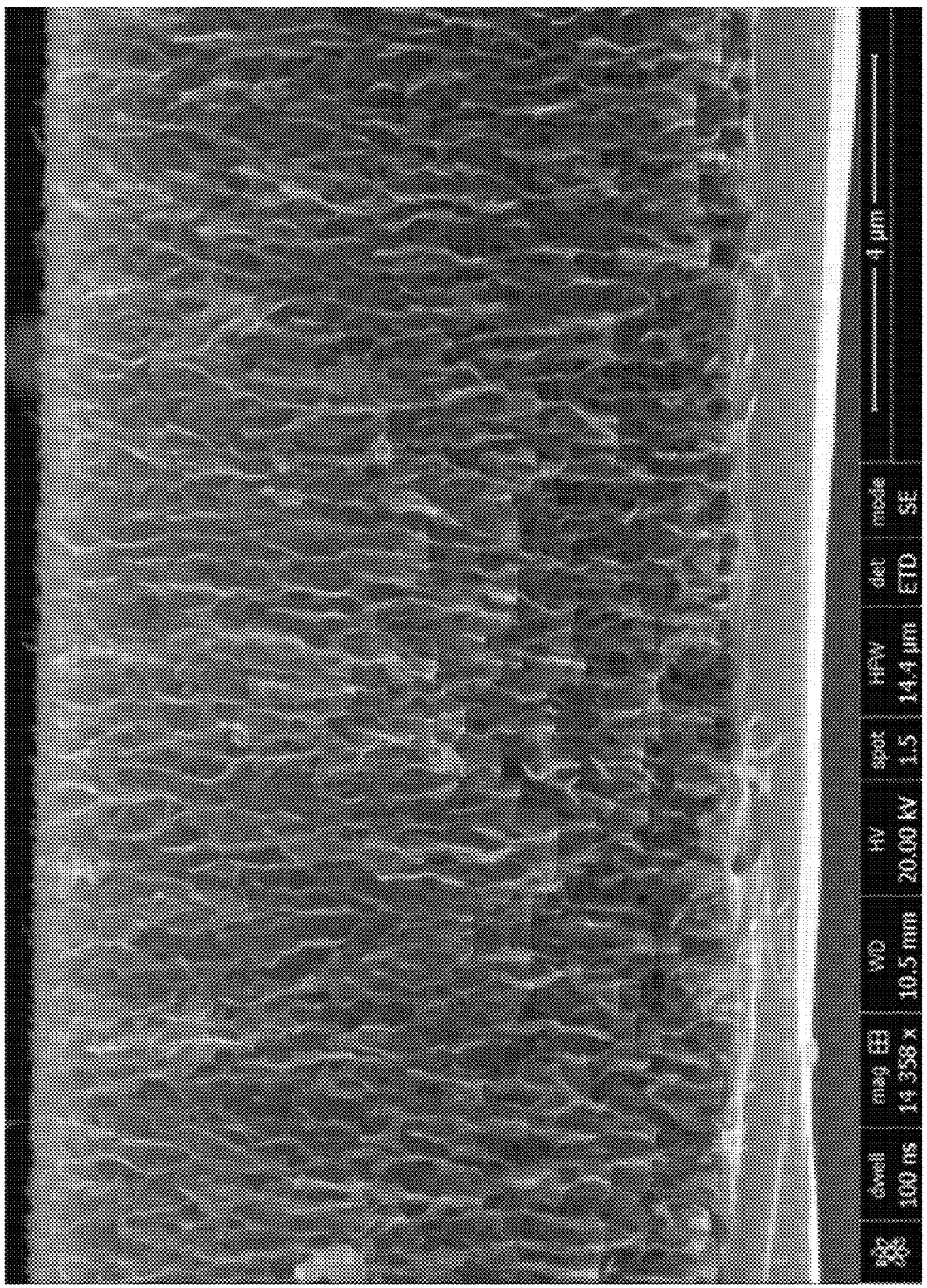
FIG. 7 is a cross-sectional SEM image of a porous silicon carbide structure, according to another embodiment of the present disclosure.

A cross-sectional SEM image of the resulting porous structure (Sample I) is shown in FIG. 7. As shown in FIG. 7, the morphology of the porous silicon carbide structure was substantially uniform throughout the porous region. For example, the diameter of the pores and the pore wall thickness are substantially the same throughout the porous region. The pores are also ordered. A denser, upper surface layer was also minimized and largely avoided, and the porosity was substantially constant throughout the structure.

Example 6

Another silicon carbide structure was electrochemically etched in accordance with the principles disclosed herein to demonstrate electrochemical etching from the "Si" face of the silicon carbide structure (Sample J). The etching solution used is provided in Table 7, and the voltage used in the electrochemical etching process was approximately 28 V.

TABLE 7

| Sample No. | Etching Solution (% v/v) |
| --- | --- |
| Sample J | 7.5% Hydrofluoric acid (Hydrofluoric acid, 49% (aqueous solution))<br>19% Ethanol<br>Balance deionized water |

Figure 8A:
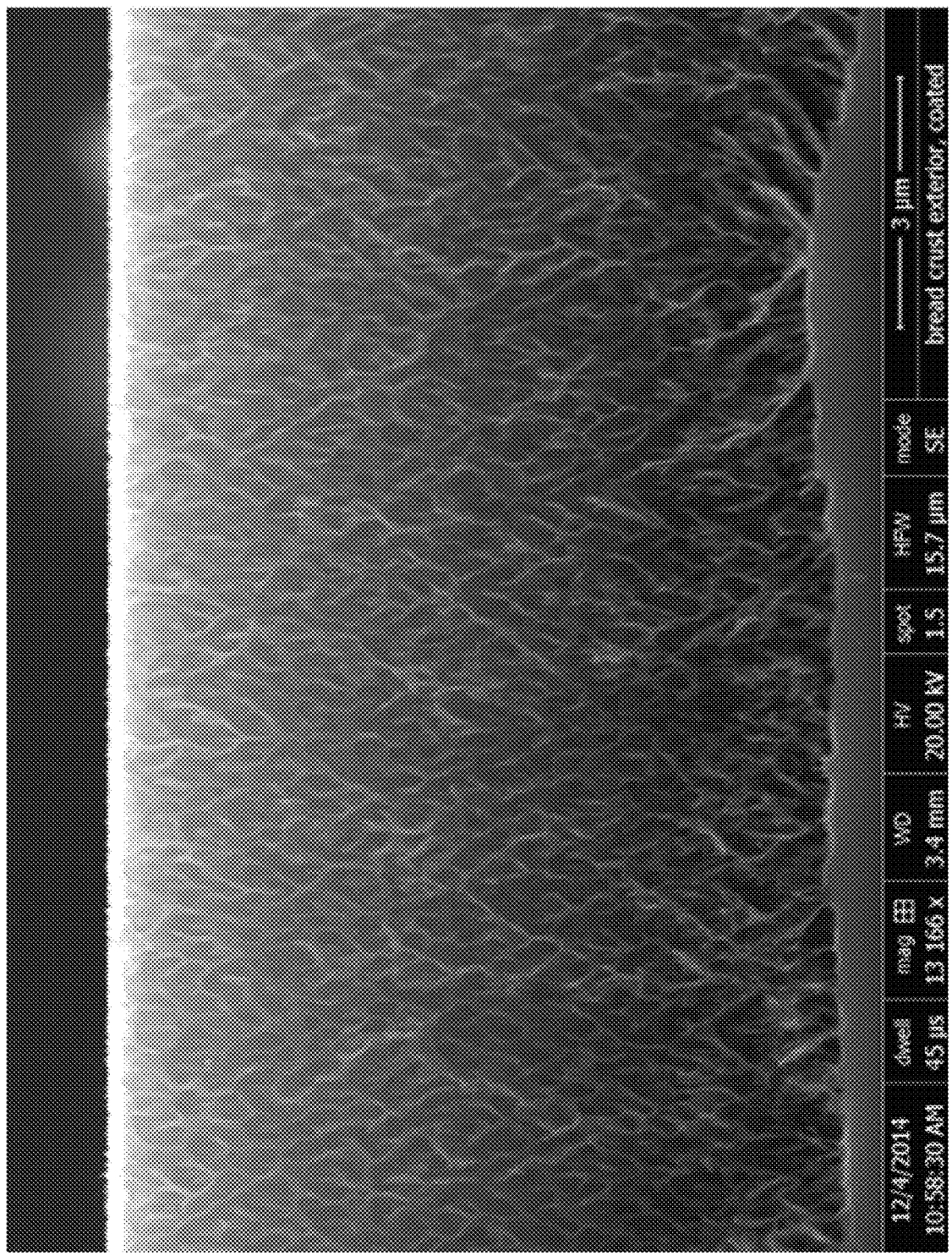
FIGS. 8A-8B are cross-sectional SEM images of a porous silicon carbide structure, according to another embodiment of the present disclosure.
Figure 8B:
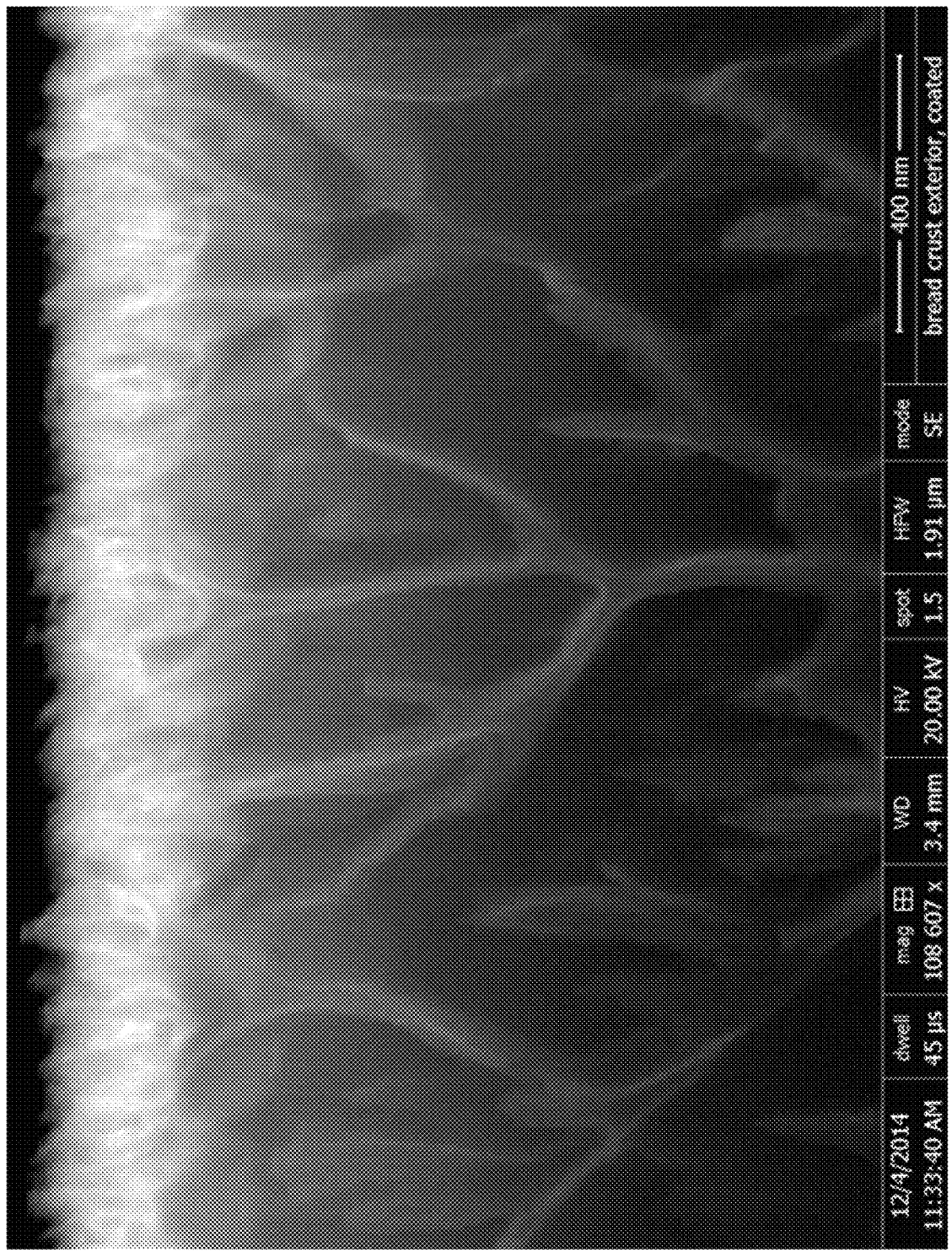
Figure 8C:
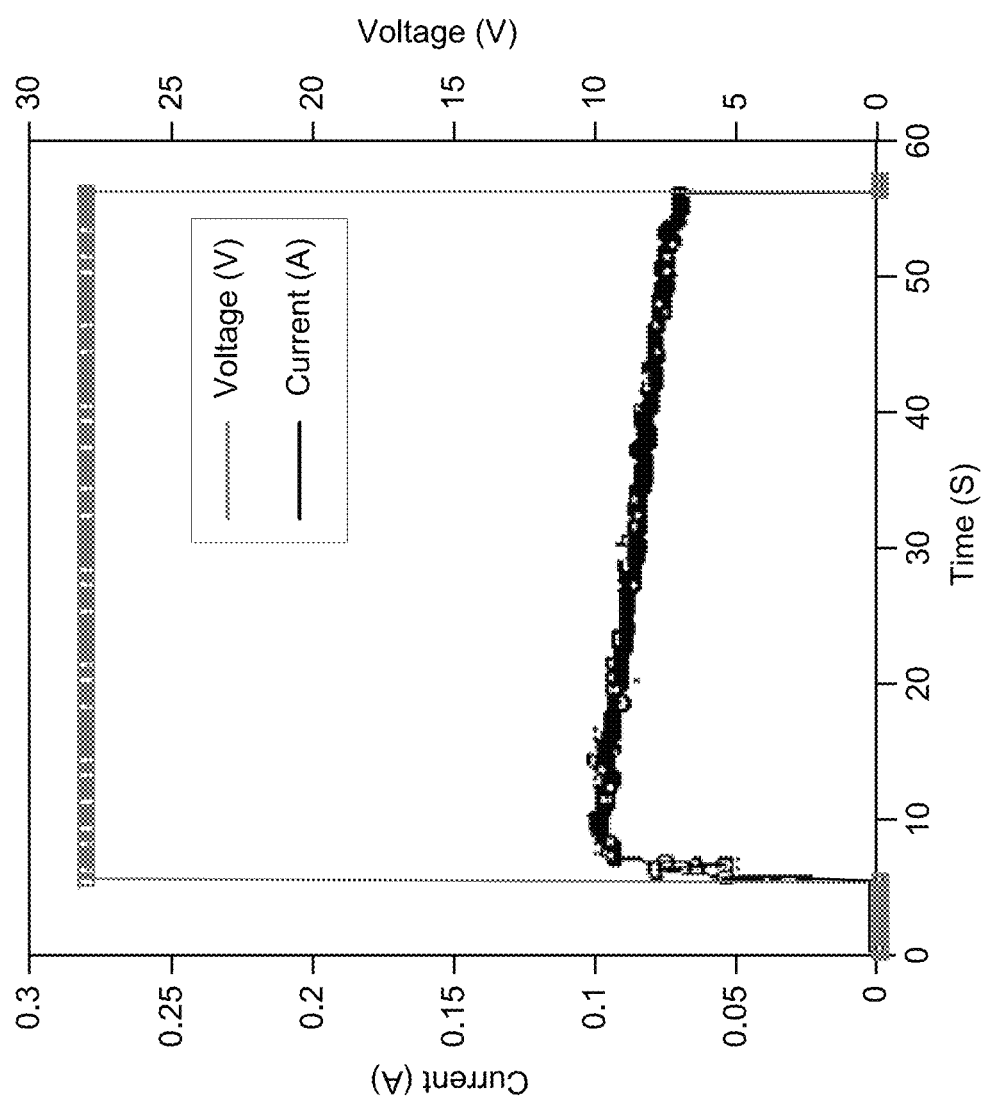
FIG. 8C is a plot of the anodization current vs. time corresponding to the electrochemical etch process used in the fabrication of the structure depicted in FIGS. 8A-8B.

A cross-sectional SEM image of the resulting porous structure (Sample J) is shown in FIGS. 8A-8B, where FIG. 8B is an enlarged image of a portion of FIG. 8A. As shown in FIGS. 8A-8B, a controlled porous silicon carbide structure having a substantially uniform morphology was achieved when etched from the "Si" face. The controlled and uniform morphology is also evidenced by the anodization current vs. time plot shown in FIG. 8C. As shown in FIG. 8C, the current decreases at a substantially constant rate over time, indicating that the pore formation is substantially uniform throughout the electrochemical etching process.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of fabricating a porous silicon carbide structure having a selected morphology, comprising:
   providing a silicon carbide structure;
   providing an etching solution comprising a reducing agent and an oxidizing agent;
   electrochemically etching the silicon carbide structure with the etching solution to produce pores through a region of the silicon carbide structure to form a porous silicon carbide structure, wherein electrochemically etching the silicon carbide structure comprises applying a voltage to a surface of the silicon carbide structure to produce a current through the region of the silicon carbide structure; and
   controlling an etch propagation rate of the etching solution through the region of the silicon carbide structure to achieve the selected morphology by changing at least one fabrication parameter including one or more of concentration of reducing agent, voltage, and use of a surfactant, wherein the current decreases at a substantially constant rate during the electrochemical etching step.

2. The method of claim 1, wherein the silicon carbide structure comprises a 3C, 4H, or 6H polytype of silicon carbide.

3. The method of claim 1, wherein the silicon carbide structure comprises a silicon carbide semiconductor.

4. The method of claim 1, wherein the silicon carbide structure comprises a predefined electronic carrier concentration.

5. The method of claim 1, wherein the silicon carbide structure comprises a predefined crystalline designation.

6. The method of claim 1, wherein the oxidizing agent comprises water, an alcohol, hydrogen peroxide, or a mixture thereof.

7. The method of claim 1, wherein the reducing agent comprises hydrofluoric acid.

8. The method of claim 7, wherein the concentration of the hydrofluoric acid is from about 1% to about 50%, from about 1% to about 20%, from about 1% to about 15%, from about 1% to about 10%, from about 1% to about 5%, or from about 2% to about 5%, by volume.

9. The method of claim 7, wherein the etch propagation rate is dependent upon the concentration of the hydrofluoric acid.

10. The method of claim 7, wherein the concentration of hydrofluoric acid is inversely proportional to a porosity of the porous silicon carbide structure.

11. The method of claim 1, wherein the etching solution further comprises a surfactant.

12. The method of claim 1, wherein the voltage is from about 20 V to about 40 V, from about 20 V to about 30 V, or from about 20 V to about 26 V.

13. The method of claim 1, wherein the current is proportional to a removal rate of the material.

14. The method of claim 1, wherein the selected morphology comprises at least one of a selected average pore diameter, a selected pore wall thickness, or a selected porosity.

15. The method of claim 1, wherein the selected morphology comprises an average pore wall thickness of between about 2 nm and about 200 nm.

16. The method of claim 1, wherein the selected morphology comprises an average pore diameter of between about 0.1 μm and about 3 μm.

17. The method of claim 1, wherein the selected morphology comprises an average pore diameter of between about 0.1 μm and about 3 μm, and an average pore wall thickness of between about 2 nm and about 200 nm.

18. The method of claim 1, wherein the selected morphology comprises a porosity of from about 60% to about 96%.

19. The method of claim 1, wherein the selected morphology comprises a substantially uniform material density.

* * * * *